(12) United States Patent
Maekawa et al.

(10) Patent No.: US 8,637,397 B2
(45) Date of Patent: Jan. 28, 2014

(54) METHOD FOR MANUFACTURING A THROUGH HOLE ELECTRODE SUBSTRATE

(75) Inventors: Shinji Maekawa, Tokyo (JP); Myuki Suzuki, Tokyo (JP)

(73) Assignee: Dai Nippon Printing Co., Ltd, Tokyo (JP)

( * ) Notice: Subject to any disclaimer, the term of this patent is extended or adjusted under 35 U.S.C. 154(b) by 0 days.

(21) Appl. No.: 13/607,011

(22) Filed: Sep. 7, 2012

(65) Prior Publication Data

US 2012/0329276 A1 Dec. 27, 2012

Related U.S. Application Data

(63) Continuation of application No. 12/855,266, filed on Aug. 12, 2010, now Pat. No. 8,288,772, which is a continuation of application No. PCT/JP2009/064886, filed on Aug. 26, 2009.

(30) Foreign Application Priority Data

Oct. 16, 2008 (JP) ................................. 2008-267870
Aug. 25, 2009 (JP) ................................. 2009-194245

(51) Int. Cl.
*H01L 21/44* (2006.01)
(52) U.S. Cl.
USPC ........... 438/667; 438/639; 438/672; 438/675; 438/678; 257/698; 257/774; 257/E21.019
(58) Field of Classification Search
USPC ......... 438/639, 641, 666, 667, 672, 675, 678, 438/FOR. 390; 257/698, 774, E21.019
See application file for complete search history.

(56) References Cited

U.S. PATENT DOCUMENTS

| 6,316,364 B1 | 11/2001 | Kubo |
| 6,379,159 B1 | 4/2002 | Mune et al. |
| 2003/0071283 A1* | 4/2003 | Heschel ........................ 257/200 |
| 2003/0102223 A1 | 6/2003 | Shimo et al. |

(Continued)

FOREIGN PATENT DOCUMENTS

| CN | 1402608 A | 3/2003 |
| CN | 1444437 A | 9/2003 |

(Continued)

OTHER PUBLICATIONS

Office action for counterpart application JP2010-202689; Nov. 9, 2010.

(Continued)

*Primary Examiner* — Thanh V Pham
(74) *Attorney, Agent, or Firm* — Pearne & Gordon LLP

(57) ABSTRACT

To provide a method of manufacturing a through hole electrode substrate which comprises forming a plurality of through holes passing through the front and back of a wafer-shaped substrate, forming an insulation film on a surface of the substrate and the though hole, forming a seed layer from a metal on at least one side of the substrate and/or the through hole, forming a metal layer having a cap shape on a bottom part of the through hole on a surface on which the seed layer is formed by an electrolytic plating method supplying direct current to the seed layer for a first time period, and filling a metal material into the plurality of through holes by an electrolytic plating method supplying a pulse current to the seed layer and the metal layer.

5 Claims, 32 Drawing Sheets

(56) References Cited

U.S. PATENT DOCUMENTS

| | | |
|---|---|---|
| 2003/0173671 A1 | 9/2003 | Hironaga et al. |
| 2003/0221967 A1 | 12/2003 | Tsuchida et al. |
| 2004/0011654 A1 | 1/2004 | Nakamura |
| 2004/0077154 A1* | 4/2004 | Nagarajan et al. ............ 438/455 |
| 2006/0022325 A1* | 2/2006 | Hwang et al. ................ 257/690 |
| 2006/0096781 A1 | 5/2006 | Yamano |
| 2006/0201201 A1 | 9/2006 | Fushie et al. |
| 2006/0216921 A1 | 9/2006 | Kato |
| 2007/0199735 A1 | 8/2007 | Kim et al. |
| 2008/0083558 A1 | 4/2008 | Chujo et al. |
| 2008/0092378 A1 | 4/2008 | Chujo et al. |
| 2008/0224271 A1 | 9/2008 | Sogawa et al. |
| 2009/0011201 A1 | 1/2009 | Ikeda et al. |
| 2009/0084588 A1 | 4/2009 | Sekine et al. |
| 2010/0103634 A1 | 4/2010 | Funaya et al. |

FOREIGN PATENT DOCUMENTS

| | | |
|---|---|---|
| CN | 1977365 A | 6/2007 |
| CN | 101066004 A | 10/2007 |
| JP | H07-082041 A | 3/1995 |
| JP | 2000-235965 A | 8/2000 |
| JP | 2000-349198 A | 12/2000 |
| JP | 2002-359469 A | 12/2002 |
| JP | 2003-060349 A | 2/2003 |
| JP | 2003-110241 A | 4/2003 |
| JP | 2004-096052 A | 3/2004 |
| JP | 2005-019577 A | 1/2005 |
| JP | 2005-045046 A | 2/2005 |
| JP | 2005-310934 A | 11/2005 |
| JP | 2006-024653 A | 1/2006 |
| JP | 2006-054307 A | 2/2006 |
| JP | 2006-135174 A | 5/2006 |
| JP | 2006-147970 A | 6/2006 |
| JP | 2006-147971 A | 6/2006 |
| JP | 2006-269860 A | 10/2006 |
| JP | 2007-095743 A | 4/2007 |
| JP | 2007-227929 A | 9/2007 |
| JP | 2010-098140 A | 4/2010 |
| JP | 2010-118645 A | 5/2010 |
| TW | 200733143 A | 1/1996 |
| WO | 03/033775 A1 | 4/2003 |
| WO | 2005/027605 | 3/2005 |
| WO | 2006-070652 A1 | 7/2006 |
| WO | 2007/083811 A1 | 7/2007 |
| WO | 2008/120755 A1 | 10/2008 |

OTHER PUBLICATIONS

Office action for counterpart application JP2011-005448; Apr. 26, 2011.
Japanese Office action for counterpart JP2010-202689 dated Nov. 9, 2010.
International Search Report for Appl. No. PCT/JP2009/064886 dated Dec. 1, 2009.
Office action issued in counterpart application No. JP2009-194245; Jul. 3, 2012.
Office action for counterpart application JP2009-194245 dated Sep. 25, 2012.
Office action for counterpart application CN20098013037.3 dated Oct. 8, 2012.
Chinese Office action for counter application No. CN20098013037.3; dated Jun. 5, 2013.
Chinese Office Action for counter application No. CN20098013037.3 dated Nov. 15, 2013.

\* cited by examiner

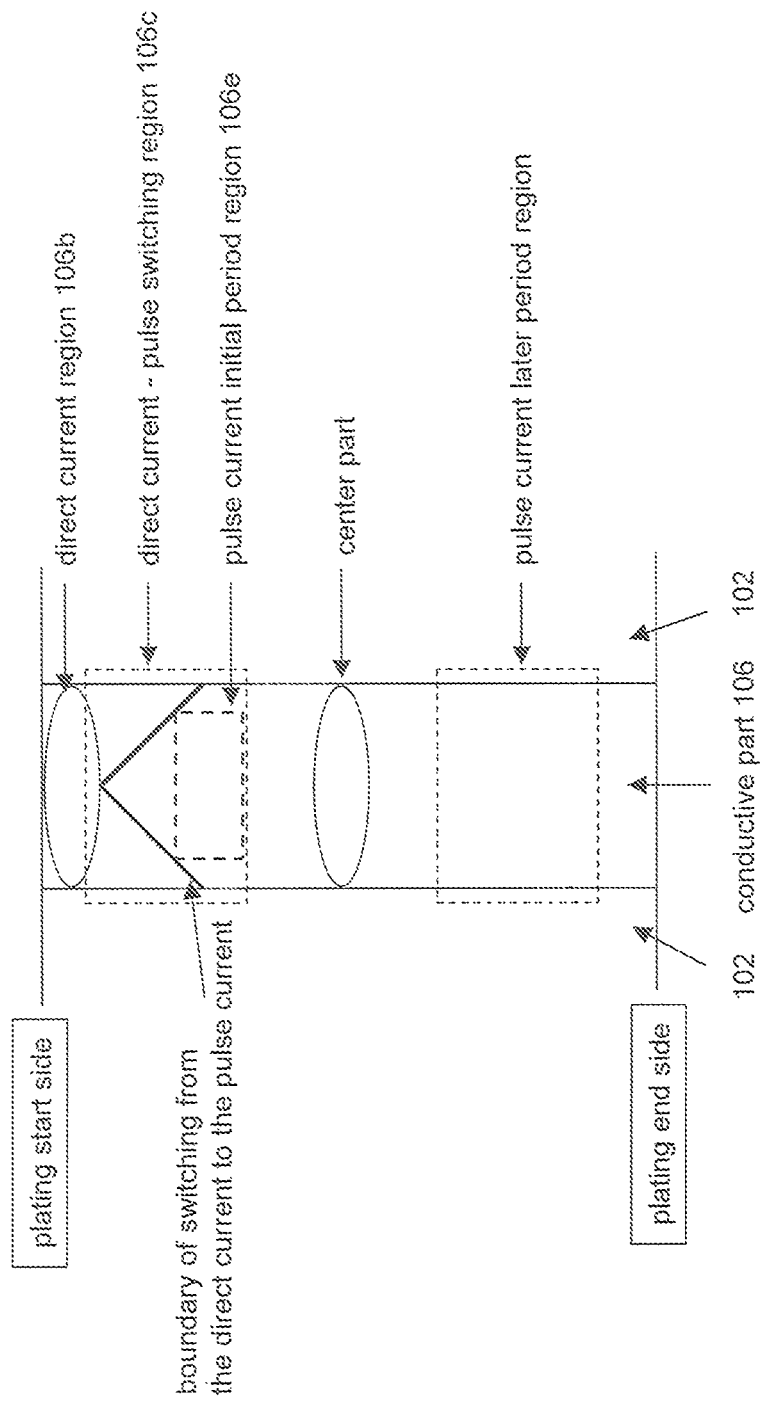

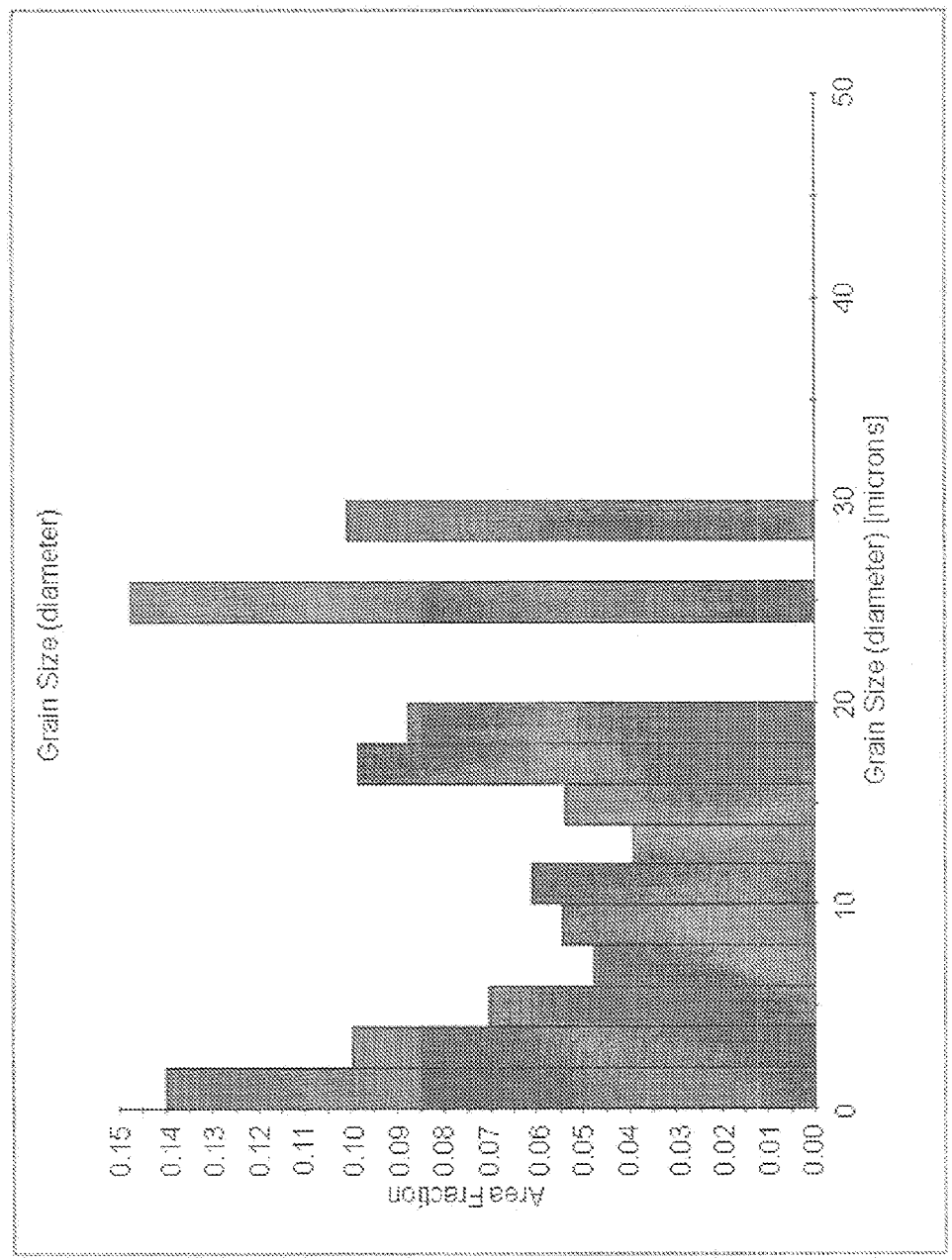

FIG.10C

Chart: Grain Size (diameter)

Edge grains included in analysis

| Diameter [microns] | Area Fraction |
|---|---|
| 1 | 0.139762 |
| 3 | 0.0995506 |
| 5 | 0.0701725 |
| 7 | 0.0477046 |
| 9 | 0.054445 |
| 11 | 0.061161 |
| 13 | 0.0393126 |
| 15 | 0.0537649 |
| 17 | 0.0983483 |
| 19 | 0.0876123 |
| 21 | 0 |
| 23 | 0 |
| 25 | 0.147547 |
| 27 | 0 |
| 29 | 0.100619 |
| 31 | 0 |
| 33 | 0 |
| 35 | 0 |
| 37 | 0 |
| 39 | 0 |
| 41 | 0 |
| 43 | 0 |
| 45 | 0 |
| 47 | 0 |
| 49 | 0 |

Average
Number  1.02604
Area    13.3866

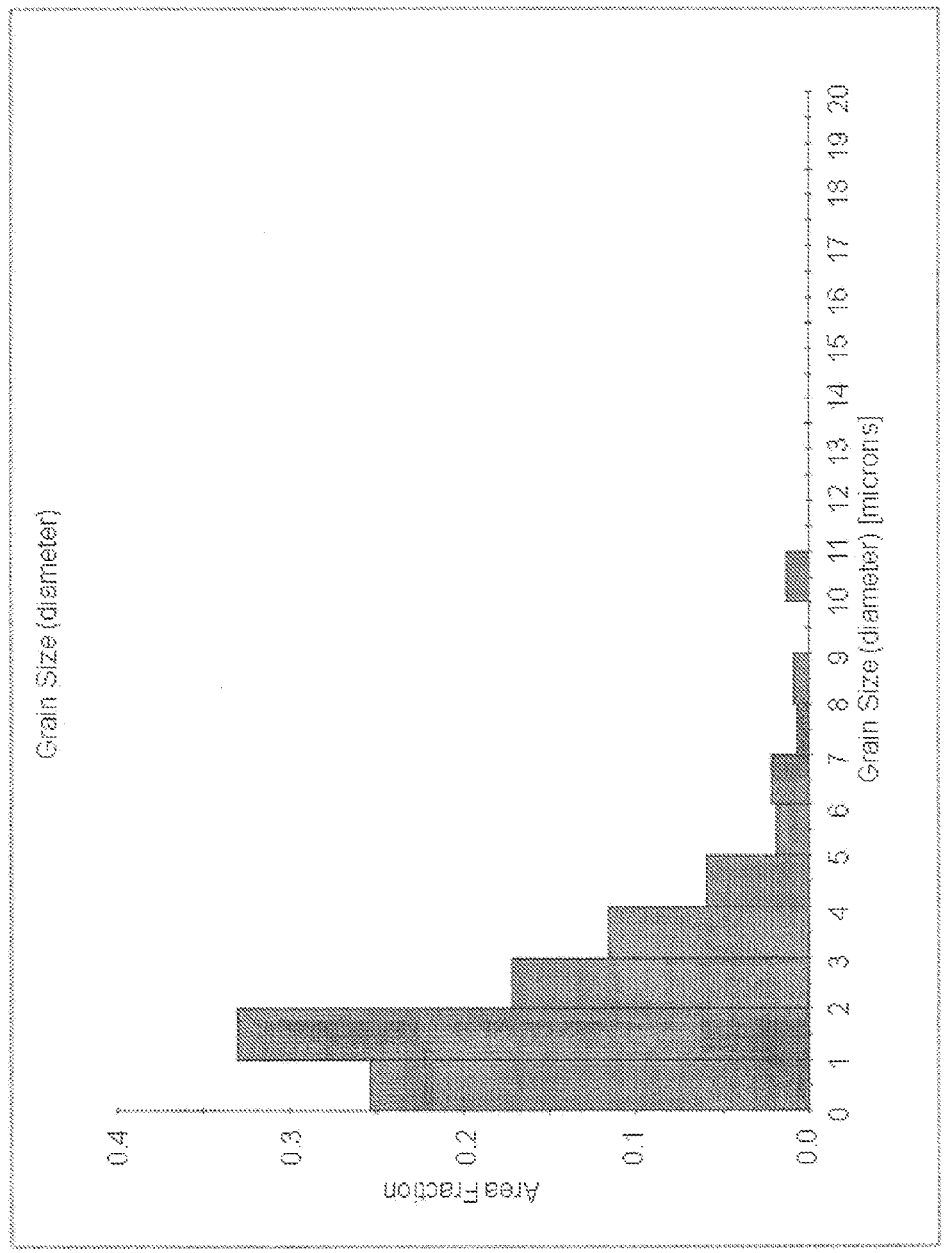

FIG.11C

Chart: Grain Size (diameter)

Edge grains included in analysis

| Diameter [microns] | Area Fraction |
|---|---|
| 0.5 | 0.253177 |
| 1.5 | 0.330356 |
| 2.5 | 0.171745 |
| 3.5 | 0.116317 |
| 4.5 | 0.0592905 |
| 5.5 | 0.0187697 |
| 6.5 | 0.0217008 |
| 7.5 | 0.00719587 |
| 8.5 | 0.00868034 |
| 9.5 | 0 |
| 10.5 | 0.0127689 |
| 11.5 | 0 |
| 12.5 | 0 |
| 13.5 | 0 |
| 14.5 | 0 |
| 15.5 | 0 |
| 16.5 | 0 |
| 17.5 | 0 |
| 18.5 | 0 |
| 19.5 | 0 |

Average
Number    0.911219
Area      2.25276

FIG.12C

Chart: Grain Size (diameter)

Edge grains included in analysis

| Diameter [microns] | Area Fraction |
|---|---|
| 0.5 | 0.231282 |
| 1.5 | 0.262066 |
| 2.5 | 0.14241 |
| 3.5 | 0.10395 |
| 4.5 | 0.115452 |
| 5.5 | 0.0526457 |
| 6.5 | 0.0283353 |
| 7.5 | 0 |
| 8.5 | 0.0249723 |
| 9.5 | 0.0150979 |
| 10.5 | 0 |
| 11.5 | 0.0238095 |
| 12.5 | 0 |
| 13.5 | 0 |
| 14.5 | 0 |
| 15.5 | 0 |
| 16.5 | 0 |
| 17.5 | 0 |
| 18.5 | 0 |
| 19.5 | 0 |

Average
Number    0.891136
Area      2.85312

FIG.13C

Chart: Grain Size (diameter)

Edge grains included in analysis

| Diameter [microns] | Area Fraction |
|---|---|
| 0.375 | 0.133368 |
| 1.125 | 0.353874 |
| 1.875 | 0.214771 |
| 2.625 | 0.126463 |
| 3.375 | 0.0691421 |
| 4.125 | 0.0424274 |
| 4.875 | 0.0270073 |
| 5.625 | 0.0191362 |
| 6.375 | 0 |
| 7.125 | 0.0138109 |
| 7.875 | 0 |
| 8.625 | 0 |
| 9.375 | 0 |
| 10.125 | 0 |
| 10.875 | 0 |
| 11.625 | 0 |
| 12.375 | 0 |
| 13.125 | 0 |
| 13.875 | 0 |
| 14.625 | 0 |

Average
Number            0.917236
Standard Deviation   0.577906
Area              1.91765

FIG. 14C

Chart: Grain Size (diameter)

Edge grains included in analysis

| Diameter [microns] | Area Fraction |
|---|---|
| 0.5 | 0.190435 |
| 1.5 | 0.180107 |
| 2.5 | 0.112152 |
| 3.5 | 0.0774558 |
| 4.5 | 0.053614 |
| 5.5 | 0.0595085 |
| 6.5 | 0.0408904 |
| 7.5 | 0.0608264 |
| 8.5 | 0.0346005 |
| 9.5 | 0.0559143 |
| 10.5 | 0.0272563 |
| 11.5 | 0.0308625 |
| 12.5 | 0.0188218 |
| 13.5 | 0 |
| 14.5 | 0.0254112 |
| 15.5 | 0 |
| 16.5 | 0.0321444 |
| 17.5 | 0 |
| 18.5 | 0 |
| 19.5 | 0 |
| Average | |
| Area | 4.82334 |

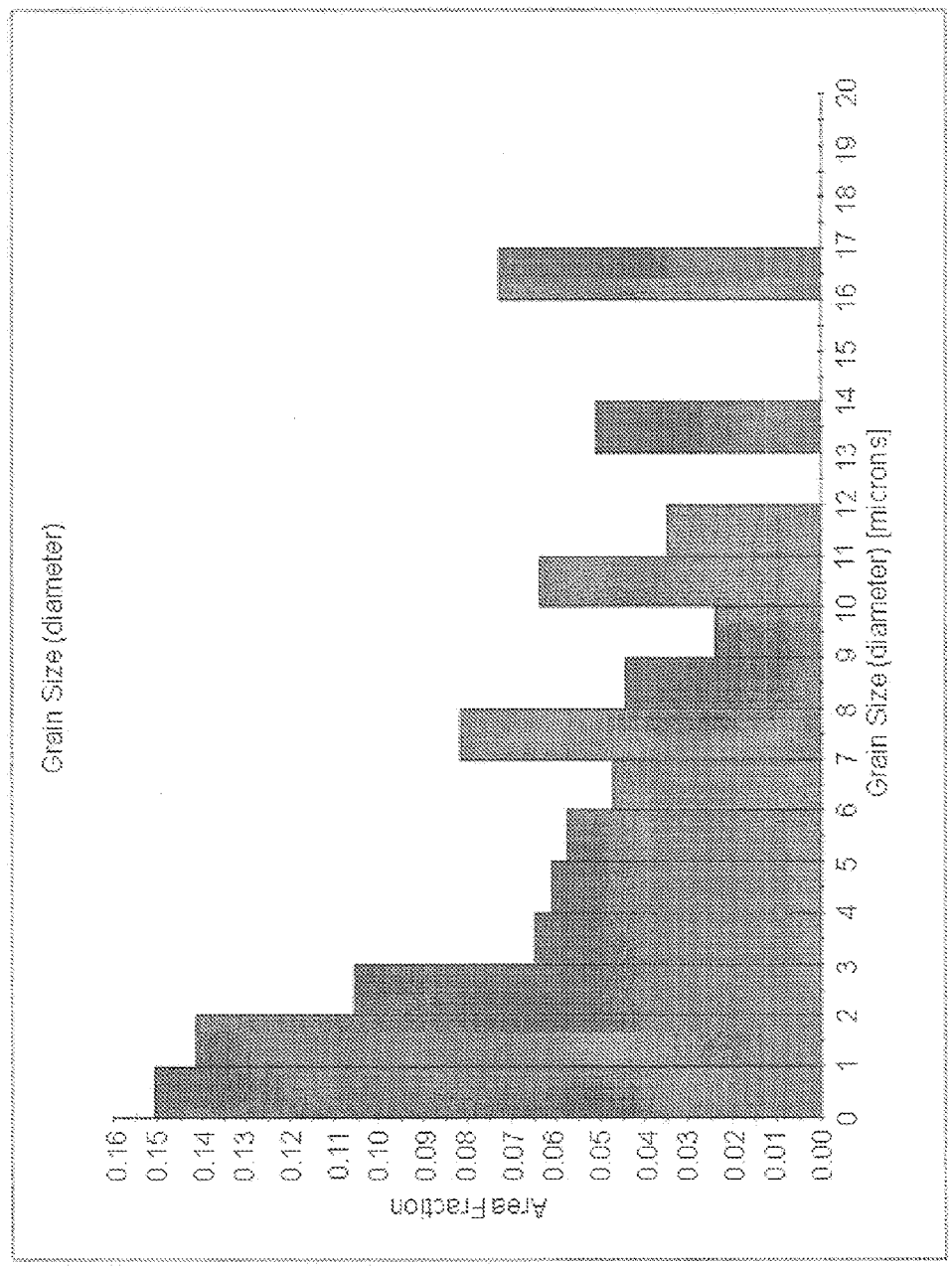

FIG.15C

Chart: Grain Size (diameter)

Edge grains included in analysis

| Diameter [microns] | Area Fraction |
|---|---|
| 0.5 | 0.150781 |
| 1.5 | 0.141415 |
| 2.5 | 0.1056 |
| 3.5 | 0.0648761 |
| 4.5 | 0.061006 |
| 5.5 | 0.0573993 |
| 6.5 | 0.0471943 |
| 7.5 | 0.0814717 |
| 8.5 | 0.0441468 |
| 9.5 | 0.0237649 |
| 10.5 | 0.0636061 |
| 11.5 | 0.0346968 |
| 12.5 | 0 |
| 13.5 | 0.0510247 |
| 14.5 | 0 |
| 15.5 | 0 |
| 16.5 | 0.0729164 |
| 17.5 | 0 |
| 18.5 | 0 |
| 19.5 | 0 |

Average
Area                5.84131

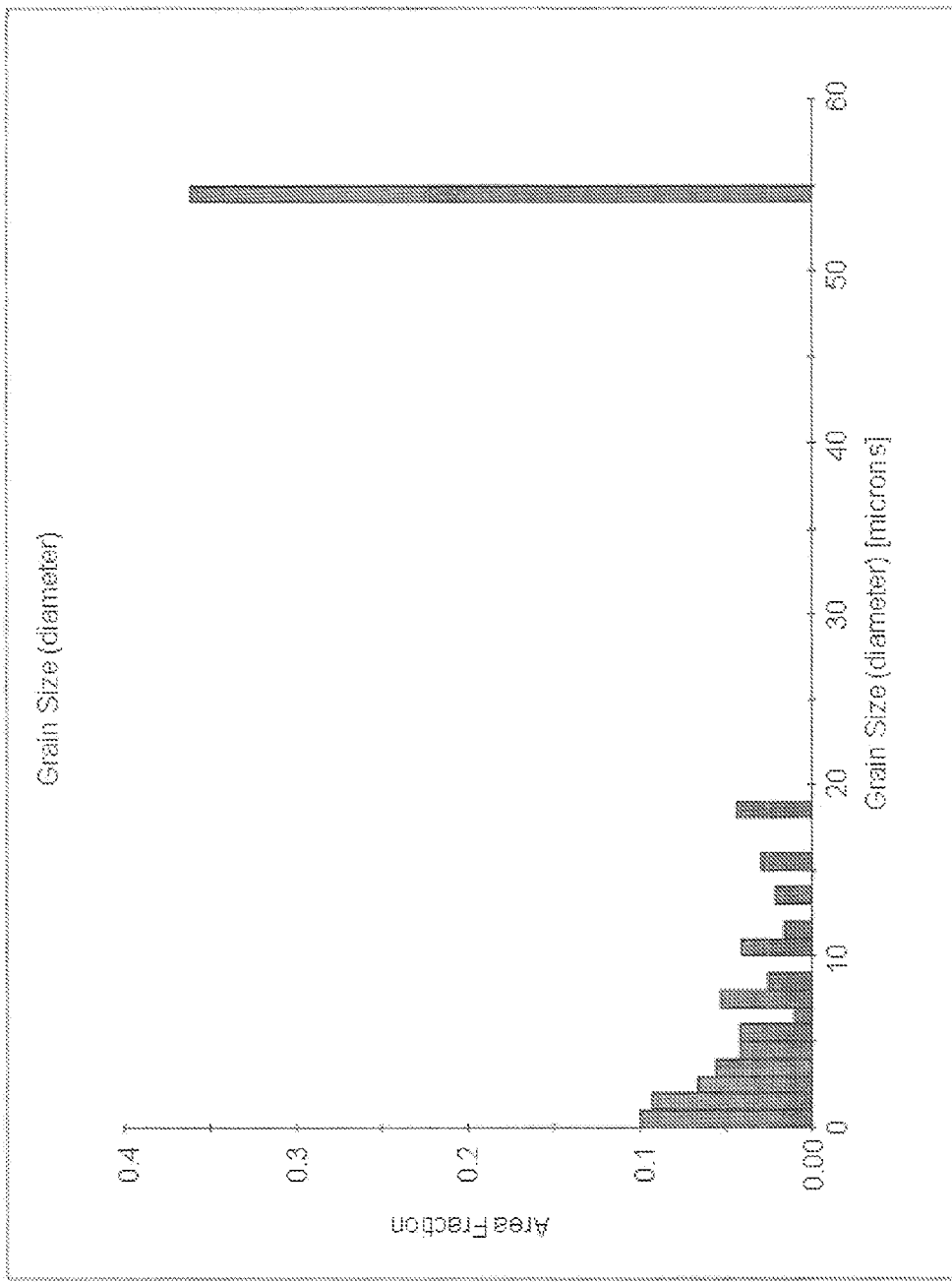

FIG.16C

| Chart: Grain Size (diameter) | | | |
|---|---|---|---|
| Edge grains included in analysis | | | |
| Diameter [microns] | Area Fraction | 30.5 | 0 |
| 0.5 | 0.0898776 | 31.5 | 0 |
| 1.5 | 0.0824348 | 32.5 | 0 |
| 2.5 | 0.0661929 | 33.5 | 0 |
| 3.5 | 0.0564812 | 34.5 | 0 |
| 4.5 | 0.0419438 | 35.5 | 0 |
| 5.5 | 0.0415956 | 36.5 | 0 |
| 6.5 | 0.0104679 | 37.5 | 0 |
| 7.5 | 0.0534321 | 38.5 | 0 |
| 8.5 | 0.0258097 | 39.5 | 0 |
| 9.5 | 0 | 40.5 | 0 |
| 10.5 | 0.0404072 | 41.5 | 0 |
| 11.5 | 0.015894 | 42.5 | 0 |
| 12.5 | 0 | 43.5 | 0 |
| 13.5 | 0.021344 | 44.5 | 0 |
| 14.5 | 0 | 45.5 | 0 |
| 15.5 | 0.0294471 | 46.5 | 0 |
| 16.5 | 0 | 47.5 | 0 |
| 17.5 | 0 | 48.5 | 0 |
| 18.5 | 0.0435284 | 49.5 | 0 |
| 19.5 | 0 | 50.5 | 0 |
| 20.5 | 0 | 51.5 | 0 |
| 21.5 | 0 | 52.5 | 0 |
| 22.5 | 0 | 53.5 | 0 |
| 23.5 | 0 | 54.5 | 0.361144 |
| 24.5 | 0 | 55.5 | 0 |
| 25.5 | 0 | 56.5 | 0 |
| 26.5 | 0 | 57.5 | 0 |
| 27.5 | 0 | 58.5 | 0 |
| 28.5 | 0 | 59.5 | 0 |
| 29.5 | 0 | | |
| | | Average Area | 23.5761 |

METHOD FOR MANUFACTURING A THROUGH HOLE ELECTRODE SUBSTRATE

CROSS REFERENCE TO RELATED APPLICATIONS

This application is a continuation of U.S. patent application Ser. No. 12/855,266, filed on Aug. 12, 2010 now U.S. Pat. No. 8,288,772, which is based upon and claims the benefit of priority from the prior Japanese Patent Application No. 2008-267870, filed on Oct. 16, 2008, Japanese Patent Application No. 2009-194245, filed on Aug. 25, 2009, and PCT Application No. PCT/JP2009/064886, filed on Aug. 26, 2009, the entire contents of which are incorporated herein by reference.

BACKGROUND OF THE INVENTION

1. Technical Field

The present invention is related to a through hole electrode substrate arranged with a through hole electrode which passes through the front and back of a substrate and a method of manufacturing the through hole electrode substrate, and is also related to a semiconductor device which uses the through hole electrode substrate. In the present invention, a semiconductor device indicates general devices which can function using semiconductor properties and semiconductor integrated circuits and electronic devices are included in the range of semiconductor devices.

2. Description of the Related Art

In recent years, the high density and small scale of electronic devices is progressing and LSI chips are becoming miniaturized to the same extent as semiconductor packaging, however, achieving high density by arranging LSI chips in only two dimensions is reaching its limit. Therefore, in order to increase packaging density it is necessary to separate LSI chips and stack them in three dimensions. In addition, in order to operate the entire semiconductor package which is stacked with LSI chips at high speeds it is necessary to bring pairs of stacked circuits close together and reduce the wiring distance between stacked circuits.

Therefore, in answer to the above demands, a through hole electrode substrate arranged with a conductive part which conducts between the front and back of a substrate is proposed as an interposer between LSI chips (Japanese Laid Open Patent 2006-54307). According to Japanese Laid Open Patent 2006-54307, the through hole electrode substrate is formed by filling a conductive material (Cu) by electrolytic plating into a through hole arranged on the substrate.

In the case of using a through hole electrode substrate in the connection between a plurality of LSI chips or in the connection between an LSI chip and MEMS device, the ability to secure conductivity with certainty in a conductive part formed by electrolytic plating and improve electrical properties such as low resistance values is demanded.

Alternatively, a technology for reducing voids in a manufacturing process of a through hole electrode is disclosed in Japanese Laid Open Patent 2006-147971. However, while an approach is examined for securing the conduction properties of a conductive part in Japanese Laid Open Patent 2006-147971, there is no examination of the electrical properties of a conductive part.

Therefore, the present invention attempts to solve the problems stated above, and proposes a through hole electrode substrate and a semiconductor device which uses the through hole electrode substrate which have improved electrical properties in a conductive part which passes through the front and back of a substrate.

BRIEF SUMMARY OF THE INVENTION

According to one embodiment of the present invention a method of manufacturing a through hole electrode substrate includes forming a plurality of through holes passing through the front and back of a wafer-shaped substrate, forming an insulation film on a surface of the substrate and the though hole, forming a seed film from a metal on at least one surface of the substrate and/or the through hole, forming a metal layer having a cap shape on a bottom part of the through hole on a surface on which the seed layer is formed by an electrolytic plating method supplying direct current to the seed layer for a first time period and filling a metal material into the plurality of through holes by an electrolytic plating method supplying a pulse current to the seed layer and the metal layer.

The electrolytic plating method may be performed by periodically applying a plus voltage and a minus voltage to the seed film.

A metal material may be filled into the through hole by an electrolytic plating method supplying a pulse current to the seed layer for a second time period after forming the metal layer on the bottom part of the through hole.

The electrolytic plating method which supplies the pulse current to the seed layer may include filling the metal material into the through hole while a current density of the pulse current is increased.

The metal material may be filled into the through hole by an electrolytic plating method supplying a pulse current with a first current density to the seed layer for a third time period then a pulse current is supplied with a second current density which is larger than the first current density to the seed layer for a fourth time period after forming the metal layer on the bottom part of the through hole.

In addition, according to one embodiment of the present invention, a method of manufacturing a through hole electrode substrate includes forming a plurality of holes with a bottom passing through the front and back of a wafer-shaped substrate, forming an insulation film on a surface of the substrate and the hole with the bottom, forming a seed layer from a metal on at least one side of the substrate and/or the hole with the bottom, forming a metal layer having a cap shape on a bottom part of the hole with the bottom on a surface on which the seed layer is formed by an electrolytic plating method supplying direct current to the seed layer for a first time period, forming a conductive part by filling a metal material into the plurality of holes with the bottom by an electrolytic plating method supplying a pulse current to the seed layer and the metal layer, and polishing the surface of the substrate being opposite to the side on which the hole with the bottom is formed until the surface of the conductive part is exposed.

The electrolytic plating method may be performed by periodically applying a plus voltage and a minus voltage to the seed layer.

A metal material may be filled into the hole with the bottom by an electrolytic plating method supplying a second time period pulse current to the seed layer for a second time period after forming the metal layer on the bottom part of the hole with the bottom.

The electrolytic plating method supplying a pulse current to the seed layer may include a process for filling the metal material into the hole with the bottom while a current density of the pulse current is increased.

The metal material may be filled into the hole with the bottom by an electrolytic plating method supplying a pulse current with a first current density to the seed layer for a third time period then a pulse current is supplied with a second current density being larger than the first current density to the seed layer for a fourth time period after forming the metal layer on the bottom part of the hole with the bottom.

BRIEF DESCRIPTION OF THE DRAWINGS

FIG. 9 is a diagram which shows a region in which a measurement is performed of a crystal grain diameter of a metal material of a conductive part 106 of the through hole electrode substrate 100 of the present invention related to one embodiment;

FIG. 10A, FIG. 10B and FIG. 10C show a distribution diagram of an area weighted crystal grain diameter of a metal material of the conductive part 106 of the through hole electrode substrate 100 of the present invention related to example one;

FIG. 11A, FIG. 11B and FIG. 11C show a distribution diagram of an area weighted crystal grain diameter of a metal material of the conductive part of the through hole electrode substrate related to comparative example one;

FIG. 12A, FIG. 12B and FIG. 12C show a distribution diagram of an area weighted crystal grain diameter of a metal material of the conductive part of the through hole electrode substrate related to comparative example two;

FIG. 13A, FIG. 13B and FIG. 13C show a distribution diagram of an area weighted crystal grain diameter of a metal material in a direct current region 106b of the conductive part 106 of the through hole electrode substrate 100 of the present invention related to example one;

FIG. 14A, FIG. 14B and FIG. 14C show a distribution diagram of an area weighted crystal grain diameter of a metal material in a direct current-pulse switching region 106c of the conductive part 106 of the through hole electrode substrate 100 of the present invention related to example one;

FIG. 15A, FIG. 15B and FIG. 15C show a distribution diagram of an area weighted crystal grain diameter of a metal material in a current initiating region 106e of the conductive part 106 of the through hole electrode substrate 100 of the present invention related to example one;

FIG. 16A, FIG. 16B and FIG. 16C show a distribution diagram of an area weighted crystal grain diameter of a metal material in a pulse current later region 106d of the conductive part 106 of the through hole electrode substrate 100 of the present invention related to example one;

EXPLANATION OF THE REFERENCE SYMBOLS

Figure 1:
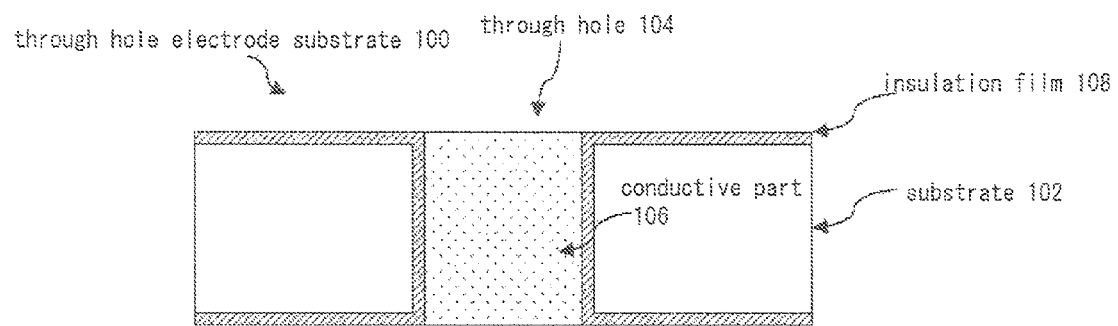
FIG. 1 is a cross sectional diagram of a through hole electrode substrate 100 of the present invention related to one embodiment.

100: through hole electrode substrate
102: substrate
104: though hole
106: conductive part
106a: center part
106b: direct current region
106c: direct current-pulse switching region
106d: pulse current later period region
106e: pulse current initial period region
107: cap plating
108: insulation film
110: seed layer
302: bump
304, 306: LSI substrate
306-1, 306-2: chip
308-1, 308-2: electrode pad

DETAILED DESCRIPTION OF THE INVENTION

The through hole electrode substrate and method of manufacturing the through hole electrode substrate related to the present invention is explained below while referring to the diagrams. However, various different forms of the through hole electrode substrate of the present invention are possible and should not be interpreted as being limited to the details described in the embodiments and examples shown below. Furthermore, in the diagrams which are referred to in the embodiments and examples of the present invention the same parts or parts which have similar functions have the same reference symbols and repeated explanations are omitted.

(1. Structure of the Through Hole Electrode Substrate)

FIG. 1 is a cross sectional diagram of a through hole electrode substrate 100 of the present invention related to the present embodiment. The through hole electrode substrate 100 of the present invention related to the present embodiment is arranged with a through hole 104 which passes through the front and back of a substrate 102 which becomes the core. A conductive part 106 is formed within the through hole 104. The substrate 102 is comprised of a semiconductor material such as silicon and the through hole 104 is formed by a method such as etching, laser, or sandblast described below. The thickness of the substrate 102 is 10 μm-800 μm, however the thickness is not limited to this. Furthermore, for the purposes of explanation only one through hole 104 is shown in FIG. 1, however, a plurality of through holes 104 may be formed in the substrate 102 and the conductive part 106 may be formed on each through hole 104. In addition, preferably, a substrate with a thickness in the range of 300 μm-800 μm or 20 μm-100 μm can be appropriately selected according to purpose.

In the present embodiment, an insulation film 108 is formed on the inner wall of the through hole 104 and the surface of the substrate 102 in order to secure electrical insulation. The insulation film 108 is comprised from $SiO_2$ for example, and is formed by a thermal oxidation method or a CVD method. The thickness of the insulation film 108 is 0.1 μm-2 μm but is not limited to this if sufficient insulation properties can be secured.

In the present embodiment, an aperture diameter of the through hole 104 is about 10 μm-100 μm. Furthermore, the aperture diameter of the through hole 104 is not limited to this and may be appropriately set according to the purpose of the through hole electrode substrate 100.

In the present embodiment the conductive part 106 is a wire which conducts through the front and back of the through hole electrode substrate 100 and a conducting material which includes a metal material is filled. In the present embodiment, the conductive part 106 is filled with a metal material by electrolytic plating described below. It is possible to use copper, for example, as the metal material used in the conductive part 106.

In the through hole electrode substrate 100 of the present invention related to the present embodiment, the metal material of the conductive part 106, as stated below, includes crystal grains having an area weighted average crystal grain diameter of 13 μm or more. In addition, in the through hole electrode substrate 100 of the present invention related to the present embodiment, the metal material of the conductive part 106, as stated below, includes a crystal grain with a maximum crystal grain diameter of 29 μm or more. In the through hole electrode substrate 100 of the present invention related to the present embodiment it is possible to improve the electrical properties of conductive part 106 by the structure stated above.

(2. Manufacturing Method of the Through Hole Electrode Substrate 100)

Here, a manufacturing method of the through hole electrode substrate 100 of the present invention related to the present embodiment will be explained while referring to FIG. 2 and FIG. 3.

(2-1. Manufacturing Method 1 of the Through Hole Electrode Substrate 100)

Figure 2:
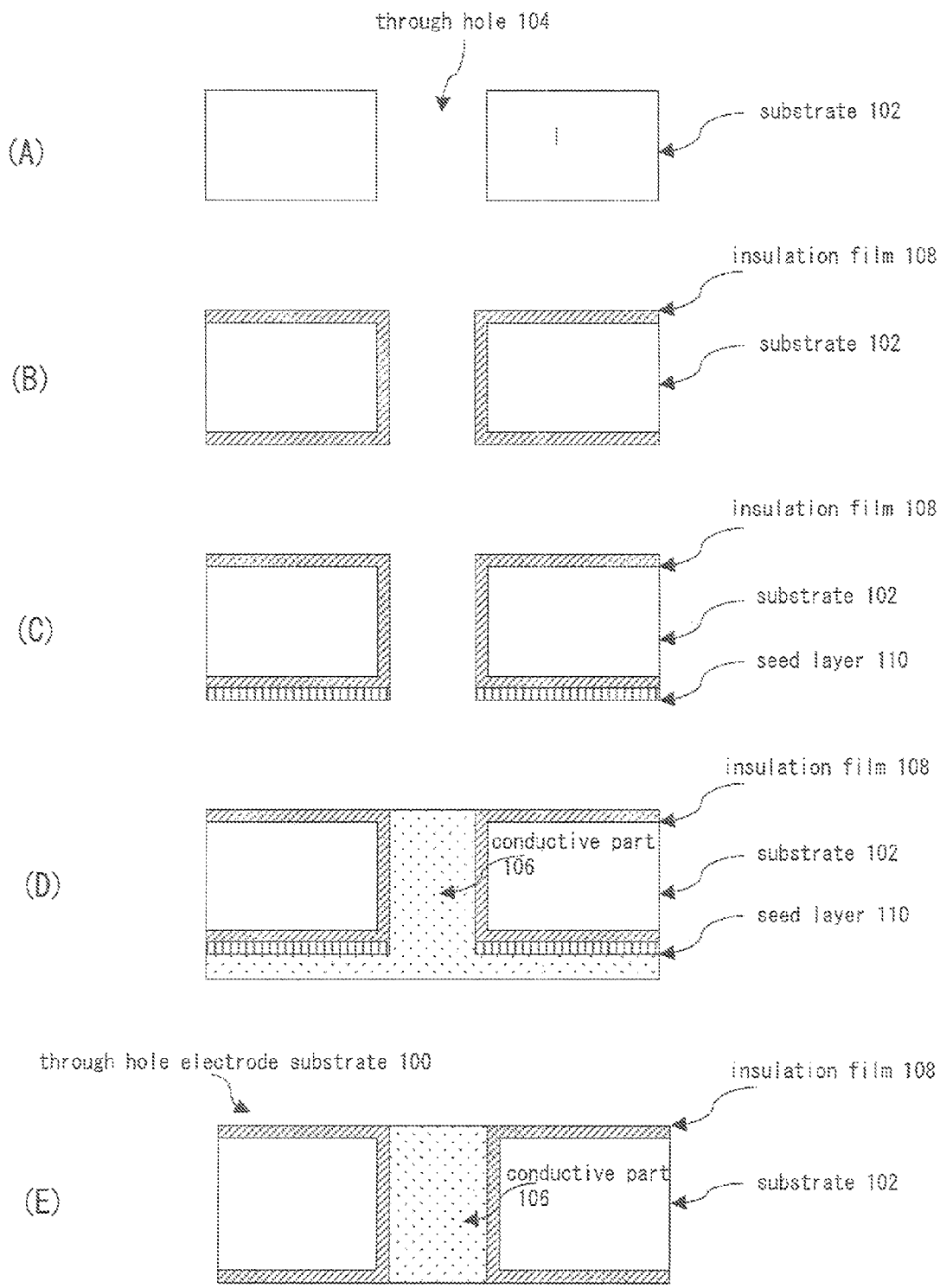
FIG. 2 is a diagram for explaining a manufacturing process of the through hole electrode substrate 100 of the present invention related to one embodiment.

(1) Preparation of Substrate 102 and Formation of Through Hole 104 (FIG. 2 (A))

In the present embodiment a substrate 102 comprised of silicon is prepared. The thickness of the substrate 102 is 300 μm-800 μm but not particularly limited. After forming a mask (not shown in the diagram) selected from a resist, silicon oxide film, silicon nitride film and metal etc. on one face of the substrate 102, the substrate 102 is etched in a thickness direction via the mask and the through hole 104 is formed. It is possible to use a RIE method or DRIE method etc. as the etching method. Furthermore, the through hole 104 which passes through the front and back of the substrate 102 may be formed only by etching and the through hole 104 may be formed by making an aperture using polishing by back grinding after forming a hole with a bottom in the substrate 102. The thickness of substrate 102 may be polished to 300 μm or less.

(2) Forming the Insulation Film 108 (FIG. 2 (B))

An insulation film 108 is formed on the surface of the substrate 102. In the present embodiment, the insulation film 108 is a silicon oxide film and is formed by a thermal oxidation method or CVD method. A silicon nitride film, silicon nitride oxide film as well as a silicon oxide film and a stacked film thereof etc. may be used as the insulation film 108.

(3) Forming a Seed Layer (FIG. 2 (C))

The seed layer 110 is formed on at least one surface of the substrate 102. The seed layer 110 is formed from a Ti layer on the substrate 102 side and above this, a Cu layer (below called a Cu/Ti layer), a Cu layer/TiN layer or Cu/Cr layer etc. In the present embodiment, a Cu/Cr layer is used for the seed layer 110. The formation methods of the seed layer 110 can be appropriately selected from a PVD sputtering method and so on. The metal material used in the seed layer 110 can be appropriately selected depending on the metal material of the conductive part 106. The seed layer 110 becomes a seed part for forming the conductive part 106 by electrolytic plating and a power supply part.

(4) Forming the Conductive Part 106 (FIG. 2 (D))

Figure 4:
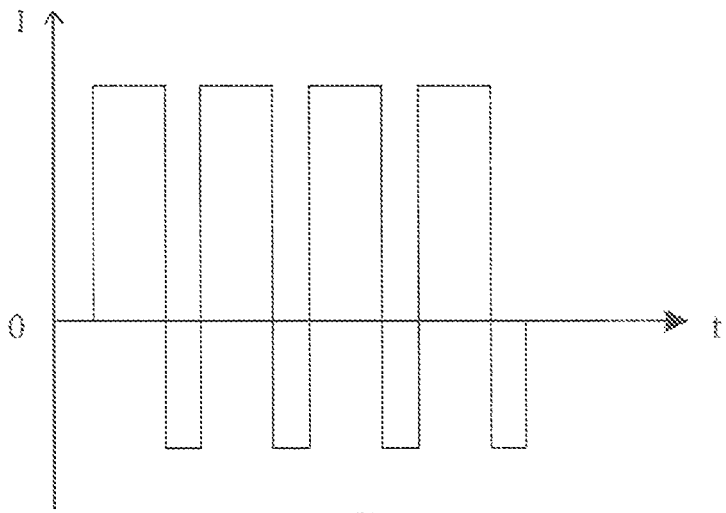
FIG. 4 is a diagram for explaining a pulse voltage used in electrolytic plating for filling a metal material into a through hole 104 of the through hole electrode substrate 100 of the present invention related to one embodiment.
Figure 5:
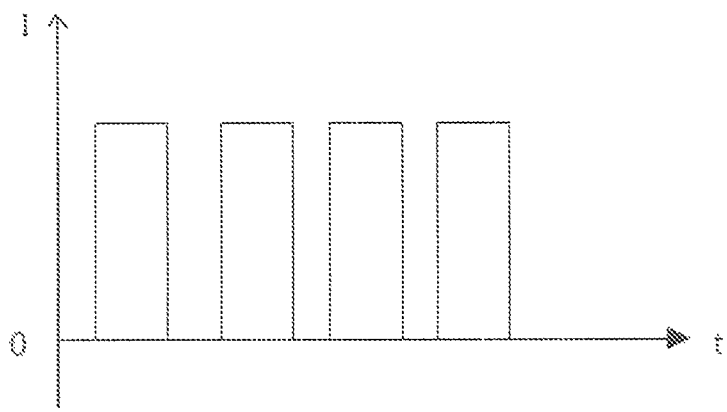
FIG. 5 is a diagram for explaining a pulse voltage used in electrolytic plating for filling a metal material into the through hole 104 of the through hole electrode substrate 100 of the present invention related to one embodiment.

Power is fed to the seed layer 110 by using an electrolytic plating method and a metal material is filled into the through hole 104. In the present embodiment, copper (Cu) is used as the metal material which is filled into the through hole 104. In the present embodiment, a metal material is filled into the through hole 104 as is shown in FIG. 4 and FIG. 5 by an electrolytic plating method which supplies a current in a pulse shape to the seed layer 110. The supply method of a pulse current as shown in FIG. 4 is a method which supplies a pulse current which does not reverse the polarity, to the seed layer 110. In addition, the supply method of the pulse current shown in FIG. 5 is a method which applies a pulse current which periodically reverses the polarity, to the seed layer 110. The plating method via the supply of the pulse current shown in FIG. 5 is called a PRC (Periodical Reversed Current) method and is one plating method which switches the current which flows to the seed layer 110 between forward (the side which is plated, that is, the seed layer 110 side which becomes a minus potential state (a state in which a positive current flows)) and reverse (the plated side, that is the seed layer 110 side which becomes a plus potential state (a state in which a negative current flows)) at fixed periods by periodically applying a plus voltage and a minus voltage to the seed layer 110, and is one plating method which is desirable. In addition, in the electrolytic plating by a pulse current in the present embodiment it is possible to appropriately select an applied voltage, a supply current, current density and pulse switching time (duty cycle). In addition, an applied voltage, a supply current, current density and pulse switching time (duty cycle) may also be changed during electrolytic plating. When a positive voltage is applied, the current which flows to the seed layer 110 by supplying a pulse current may be 0.5 A or more and 1.5 A or less, and −6 A or more and −2 A or less when a negative current is applied.

Figure 6:
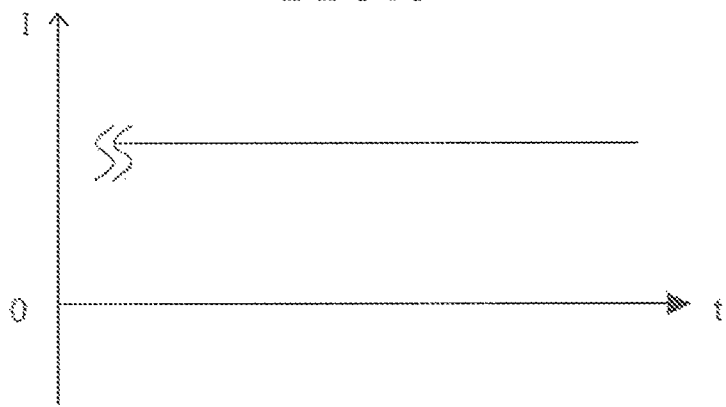
FIG. 6 is a diagram for explaining a direct voltage used in electrolytic plating for filling a metal material into the through hole 104 of the through hole electrode substrate 100 of the present invention related to one embodiment.

Furthermore, before supplying a pulse current, a metal layer having a cap shape may be formed on the bottom part of the through hole 104 on the surface on which the seed layer 110 is formed by the electrolytic plating method which supplies a fixed direct current to the seed layer 110 as is shown in FIG. 6. It is possible to use a material selected from metals such as gold (Au), rhodium (Rh), silver (Ag), platinum (Pt), tin (Sn), aluminum (Al), nickel (Ni), chrome (Cr) etc. as well as Cu and a combination of these as an alloy etc. as the metal material which is filled into the through hole 104.

In the case of supplying a direct current and forming a cap shaped metal layer, a method in which current density is made small within a fixed period of time in the initial stage when switching to a pulse current and gradually (for example, in stages or proportionally to the time elapsed) increased is preferred. When a direct current is supplied and a cap shaped metal layer is formed, the growth of the metal layer tends to quicken in a part which contacts the through hole 104. As a result, the cap shaped metal layer has a shape which bends towards the center part. It is though that growth of the metal layer occurs so that this bent part is planarized by supplying a pulse current with a small current density in a fixed period of time at the initial stage when switching to a pulse current. By using this type of electrolytic plating method, a through hole electrode having excellent electrical properties is obtained and manufacturing properties of the through hole electrode substrate are improved.

(5) Removal of Unnecessary Parts (FIG. 2 (E))

The conductive part 106 is formed by removing the unnecessary parts of the seed layer 110 and conductive part 106 by etching or CMP (Chemical Mechanical Polishing). It is possible to obtain the through hole electrode substrate 100 of the present invention related to the present embodiment by the process described above.

(2-2. Manufacturing Method 2 of the Through Hole Electrode Substrate)

Here, a different example of a method of manufacturing the through hole electrode substrate 100 of the present invention related to the present embodiment. The same structure as the manufacturing method of 1 of the through hole electrode substrate 100 stated above may be omitted below. Furthermore, the manufacturing method 2 of the through hole electrode substrate 100 of the present invention related to the present embodiment explained here is often used in the case where a relatively shallow through hole (for example, about 20 μm-100 μm) or a thin through hole electrode substrate having a thickness of about 20 μm-100 μm is desired.

Figure 3:
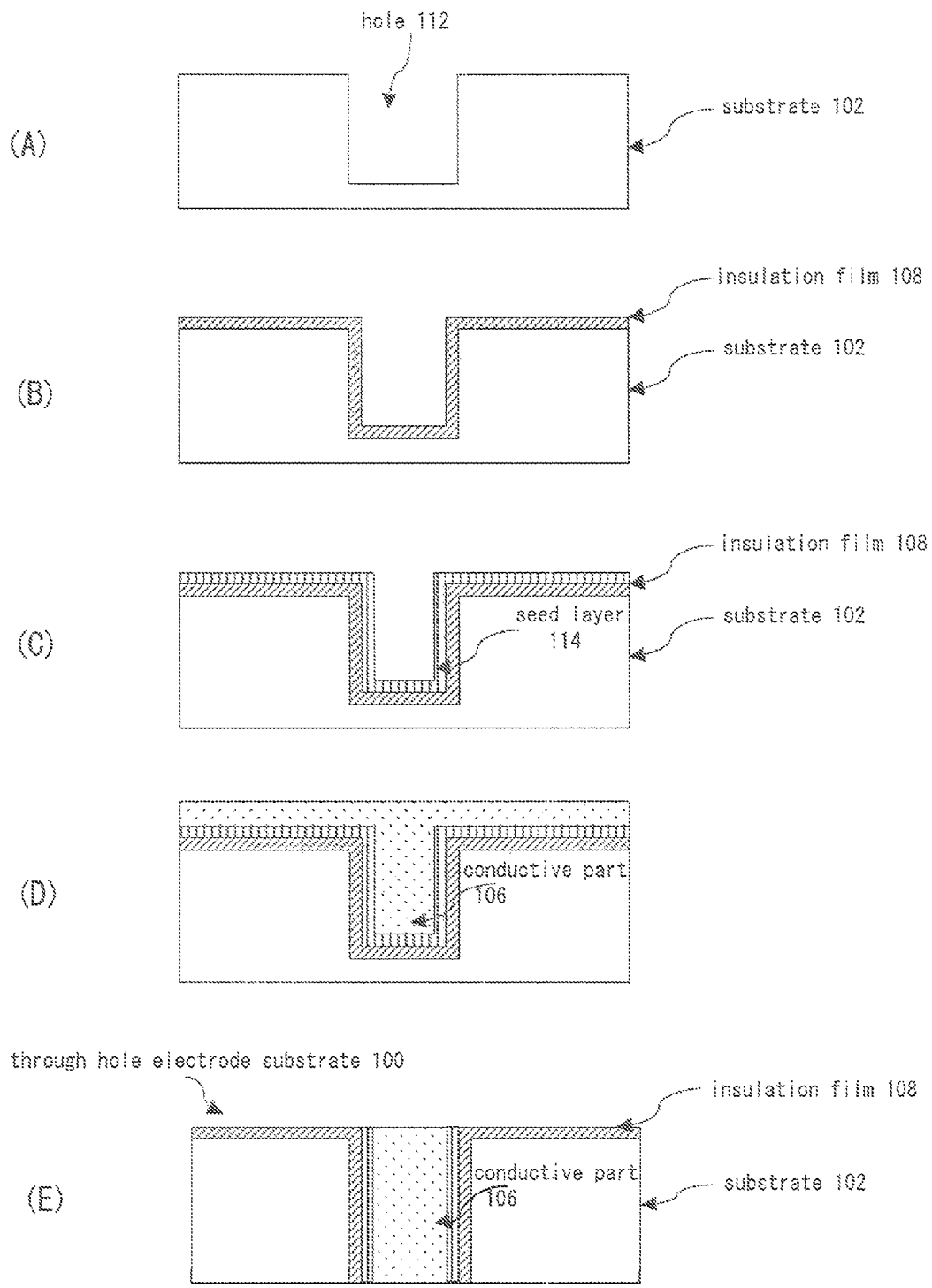
FIG. 3 is a diagram for explaining a manufacturing process of the through hole electrode substrate 100 of the present invention related to one embodiment.

(1) Preparing the Substrate 102 and Forming a Hole (FIG. 3 (A))

After forming a mask (not shown in the diagram) selected from a resist, silicon oxide film, silicon nitride film or metal etc., on one surface side of the substrate 102, the substrate 102 is etched in a thickness direction via the mask and a hole with a bottom 112 which does not pass through the substrate 102 is formed. It is possible to use a RIE method or DRIE method etc. as the etching method.

(2) Forming an Insulation Film 108 (FIG. 3 (B))

An insulation film 108 is formed on the surface of the substrate 102.

(3) Forming a Seed Layer (FIG. 3 (C))

A seed layer 114 is formed on the surface of the substrate 102 on which the insulation film 108 is formed. This seed layer 114 is also formed within the hole 112 as is shown in FIG. 3 (C). The seed layer 114 is comprised of a Cu layer/TiN layer etc. the same as the seed layer 110. The seed layer 114 becomes a seed part for forming the conductive part 106 by electrolytic plating, and a power supply part the same as the seed layer 110. The seed layer 114 is formed by a MOCVD method, sputtering method or a deposition method etc.

(4) Forming the Conductive Part 106 (FIG. 3 (D))

Power is fed to the seed layer 114 using an electrolytic plating method and a metal material is filled into the hole 112. Also in the manufacturing method 2 of the through hole electrode substrate of the present embodiment, a metal material is filled into the through hole 112 by using an electrolytic plating method which supplies a pulse shaped current to the seed layer 110 as is shown in FIG. 4 and FIG. 5 the same as in the manufacturing method 1 of the through hole electrode substrate. Furthermore, a fixed direct current may be supplied to the seed layer 110 before a pulse current is supplied as is shown in FIG. 6. In the present embodiment, copper (Cu) is used as the metal material which is filled into the hole 112. It is possible to use a material selected from metals such as gold (Au), rhodium (Rh), silver (Ag), platinum (Pt), tin (Sn), aluminum (Al), nickel (Ni), chrome (Cr) as well as Cu and a combination of these as an alloy as the metal material which is filled into the through hole 104.

(5) Removal of Unnecessary Parts (FIG. 3 (E))

The unnecessary parts of the seed layer 114 and conductive part 106 are removed by etching or CMP. The conductive part 106 is formed by polishing until the surface of the conductive part 106 is exposed by back grinding the surface of the substrate 102 which is opposite to the side on which the hole 112 is formed. The thickness of the substrate 102 may also be made thinner by polishing. It is possible to obtain the through hole electrode substrate 100 of the present invention related to the present embodiment by the process described above.

Example One

An example of the through hole electrode substrate 100 of the present invention will be explained below. After cleaning a 650 μm thick substrate 102, a resist is coated on one surface side of the substrate 102 and a mask (not shown in the diagram) is formed by exposure and developing. Following this, the substrate 102 is etched in a thickness direction by a DRIE method via this mask and a hole with a bottom 112 having a thickness of 430 μm is formed (FIG. 2 (A)). After removing the mask comprised of the resist, the substrate 102 is polished until it is 400 μm thick by back grinding.

After cleaning the substrate 102, a 1 μm thick thermally-oxidized film is formed on the surface of the substrate 102 by a thermal oxidation method. Following this, a 200 nm silicon nitride film is formed by a LPCVD method. This thermally-oxidized film and silicon nitride film form the insulation film 108 (FIG. 2 (B)).

A seed layer 110 is formed by depositing Cr with a thickness of 30 nm and Cu with a thickness of 200 nm in this order on one surface of the substrate 102 (FIG. 2 (C)).

Following this, an ashing process is performed on the substrate 102. Next, power is fed to the seed layer 110 using the electrolytic plating method by the supply of a direct current shown in FIG. 6, and a cap shaped metal layer is formed on the bottom part of the through hole 104 of the surface on which the seed layer 110 is formed. In embodiment one, after supplying a current of 1.54 A and a direct current with a current density of 1 A/dm$^2$, power is fed to the seed layer 110 using the electrolytic plating method by applying a pulse voltage shown in FIG. 5 and Cu is filled into the through hole 104 (FIG. 2 (D)). The pulse switching time is set at supplying a positive current for 80 msec and a negative current for 2 msec. A 1.05 A (current density 3 A/dm$^2$) current flows when a positive current is supplied and a −4.2 A (current density −12 A/dm$^2$) current flows when a negative current is supplied.

Furthermore, a small current is supplied during the first 1 hour when starting to fill Cu by the electrolytic plating method by supplying the pulse current shown in FIG. 5, and a 0.35 A current (current density 1 A/dm$^2$) flows when a positive current flows and a −1.4 A current (current density −4 A/dm$^2$) flows when a negative current flows. A through hole electrode with excellent electrical properties is obtained and the manufacturing properties of the through hole electrode substrate are improved by using this electrolytic plating method.

After cleaning the substrate 102, the conductive part 106 is formed by removing the unnecessary parts of the seed layer 110 and the conductive part 106 by CMP. The through hole electrode substrate 100 of the present invention related to the present example can be obtained by the process described above.

(3. Analysis of a Crystal State by an Electron Backscatter Diffraction Pattern ESBD)

Figure 7:
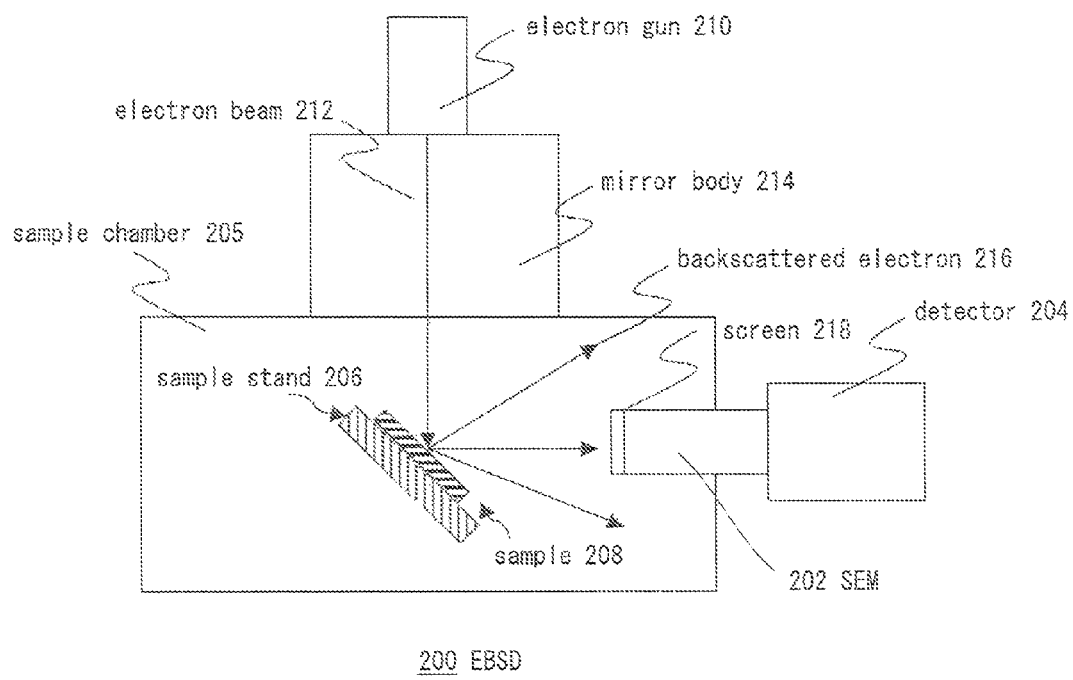
FIG. 7 is a diagram for explaining the structure of an EBSD device.
Figure 8:
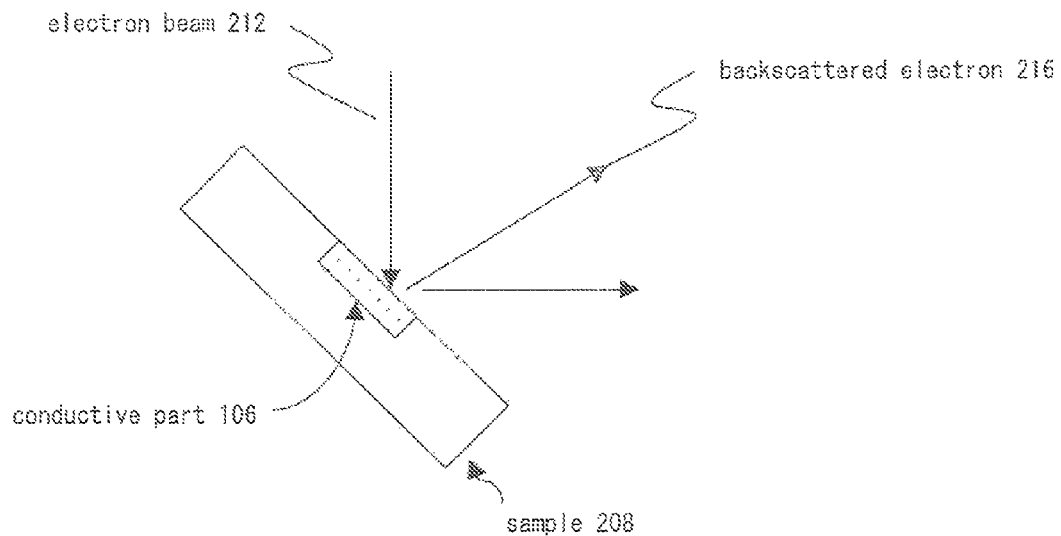
FIG. 8 is a diagram for explaining the concept of a sample measurement measured by the EBSD.

Here, an electron backscatter diffraction pattern ESBD used in an analysis of the crystal grain diameter of a metal material of the conductive part 106 related to the present embodiment is explained while referring to FIG. 7 and FIG. 8.

(3-1. Explanation of EBSD)

(Measuring Crystal Grain Diameter)

A measurement of the crystal grain diameter of a metal material which forms the conductive part 106 of the though hole electrode substrate 100 of the present invention related to the present embodiment is performed by an EBSD method. FIG. 7 is a diagram for explaining the structure of an EBSD device. In addition, FIG. 8 is a diagram for explaining the concept of a sample measurement measured by the EBSD device. When measuring the crystal grain diameter of the conductive part 106 related to the present embodiment an adjustment is made so that an electron beam 212 is irradiated on a cross section part of the conductive part 106.

The EBSD machine 200 is arranged with a special detector 204 which is arranged on a SEM (Scanning Electron Microscope) 202, and is a means for analyzing crystal orientation from a backscattered electron of a primary electron. Specifically, when the electron beam 212 emitted from an electron gun 210 is irradiated via a mirror body 214 onto a sample 208 having a crystal structure which is placed on a sample stand 206 within a sample chamber 205, inelastic scattering occurs in the sample 208 and a backscattered electron 216 is generated. Among these, a particular line shaped pattern (usually called a kikuchi pattern) is observed together with the crystal orientation by Bragg diffraction within the sample 208. This backscattered electron 216 is detected by the detector 204 of the SEM 202 via a screen 218. Then, it is possible to measure the crystal grain diameter of the sample 208 by analyzing the kikuchi pattern detected.

In the case of a crystal structure in which each crystal grain diameter is different, it is possible to obtain data of the crystal grain diameter with regards to a planate sample 208 by repeatedly measuring the crystal grain diameter (mapping measurement) while moving the position of an electron beam irradiated on to the sample 208. The area (A) of a crystal grain is calculated by multiplying the area of a measurement point determined by the step size (s) of a measurement, by the number (N) of crystal grains. It is possible to express the area (A) of the crystal grain by the following formula (1) by expressing a measurement point in the EBSD measurement as a hexagonal.

$$A = N\sqrt{3}/(2s^2) \quad (1)$$

A crystal grain diameter (D) is calculated as a diameter of a circle having an area equal to the crystal grain area (A). The crystal grain diameter (D) can be expressed by the following formula (2).

$$D = (4A/\pi)^{1/2} \text{ (However, } \pi \text{ is the circumference ratio)} \quad (2)$$

Crystal grain diameter defined in the present specification indicates a value measured in the manner described above. In addition, Edge Grain is included in the measurement of a crystal grain diameter.

Next, results of an EBSD measurement of a metal material which forms the conductive part 106 of the through hole electrode substrate 100 of the present invention in the example one and the metal material which forms the conductive part of the though hole electrode substrate of comparative example one and comparative example two (details of the process are described below) are explained. Here, a measurement sample is made by a so-called ion polish method in which a cross section of a metal material which forms each of the conductive parts is processed by argon ions. In addition, the measurement points in an EBSD measurement are each around the center part 106a in a depth direction of the conductive part shown in FIG. 9.

Figure 10A:

FIG. 10A, FIG. 10B and FIG. 10C show a distribution diagram of an area weighted crystal grain diameter of a metal material of the conductive part 106 of the through hole electrode substrate 100 of the present invention related to example one. It is possible to calculate a maximum value and an average value of the diameter of a crystal grain which forms the conductive part 106 using a histogram with the crystal grain diameter (D) on the horizontal axis and the area ratio (Rs) on the vertical axis.

Here, the area ratio Rs ((area weighted) ratio which includes the crystal grain diameter)) can be expressed by the following formula (3) using the area (Sm) of a measurement region.

$$Rs = A \times (N/Sm) \quad (3)$$

The horizontal axis of the histogram shown in FIG. 10B is value (D) of the crystal grain diameter, and the vertical axis (area fraction) is shown by a ratio including the crystal grain of that value weighted. For example, 0.15 of the vertical axis in FIG. 10B means a ratio of 15%. Then, by adding up values by which the ratio (Rs) is multiplied by each crystal grain diameter (D), the area weighted average crystal grain diameter (Ds) is determined by the following formula (4).

$$Ds = \Sigma\{Rs \times D\} \quad (4)$$

In the present example, because the measurement region is limited (50 μm×150 μm in the present embodiment) in the measurement of the crystal grain diameter, the area region stated above is cut from a desired region and observed. A value which includes a crystal grain which is included in an edge of a measurement region is the crystal grain diameter in the specification. In addition, because an analysis result includes errors a figure which is discarded is used without regard for numbers less than a decimal point.

The measurement conditions are as follows.
Analysis Device Used
SEM JEOL manufactured JSM-7000 FEBSD TSL manufactured OIM software Ver. 4.6
Observation Conditions
EBSD Measurement
  Acceleration voltage 25 kV
  Sample inclination angle 70°
  Measurement step 0.3 μm The maximum grain diameter of a metal material of the conductive part 106 of the through hole electrode substrate 100 of the present invention in example one was 29 μm and the average grain diameter (area weighted) was 13 μm. As a result of evaluating the electrical properties of the conductive part 106, the resistance value of the conductive part 106 of the through hole electrode substrate 100 of the present invention in example one was $3.15 \times 10^{-4} \Omega$ and it was confirmed that the conductive part 106 had excellent electrical properties and was superior.

Figure 11A:
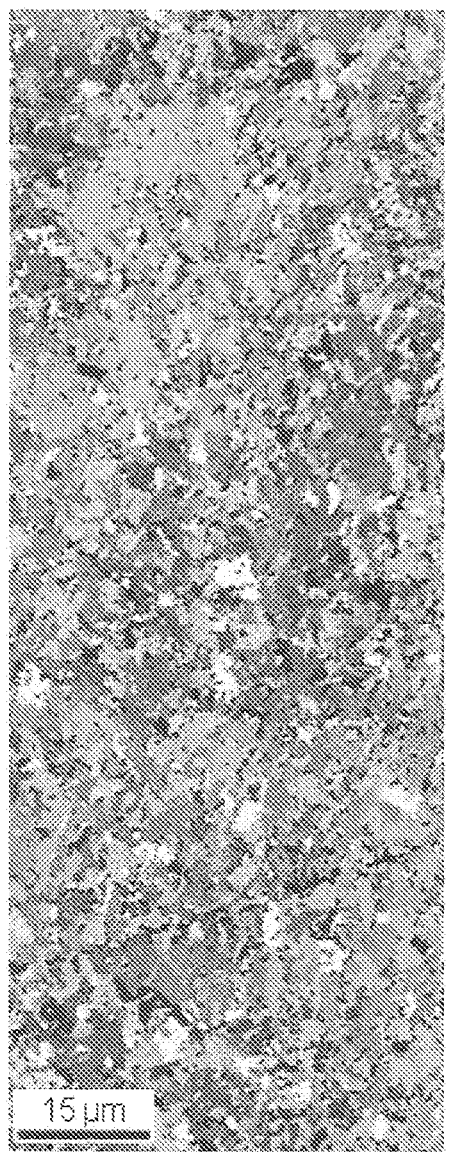

An area weighted crystal grain diameter distribution chart of the crystal of a metal material which forms the conductive part of the through hole electrode substrate in comparative example one (in comparative example one, because the processes up to filling a metal material into the through hole are the same as in example one, the diameter and length (that is, thickness of the substrate) of the conductive part 106 in example one and the diameter and length (that is, thickness of the substrate) of the conductive part in comparative example one are the same) are shown in FIG. 11A, FIG. 11B and FIG. 11C. The maximum grain diameter of a metal material which forms the conductive part of the through hole electrode substrate in comparative example one was 10 μm and the average grain diameter (area weighted) was 2 μm. The resistance value of the conductive part 106 of the through hole electrode substrate 100 in comparative example one was $7.25 \times 10^{-3} \Omega$ and it was confirmed that the electrical properties of the conductive part 106 were poor compared to example one.

Consequently, the resistance of the conductive part 106 of the through hole electrode substrate 100 of the present invention in example one became smaller by as much as 1/23 compared to the resistance of the conductive part in comparative example one.

Figure 12A:
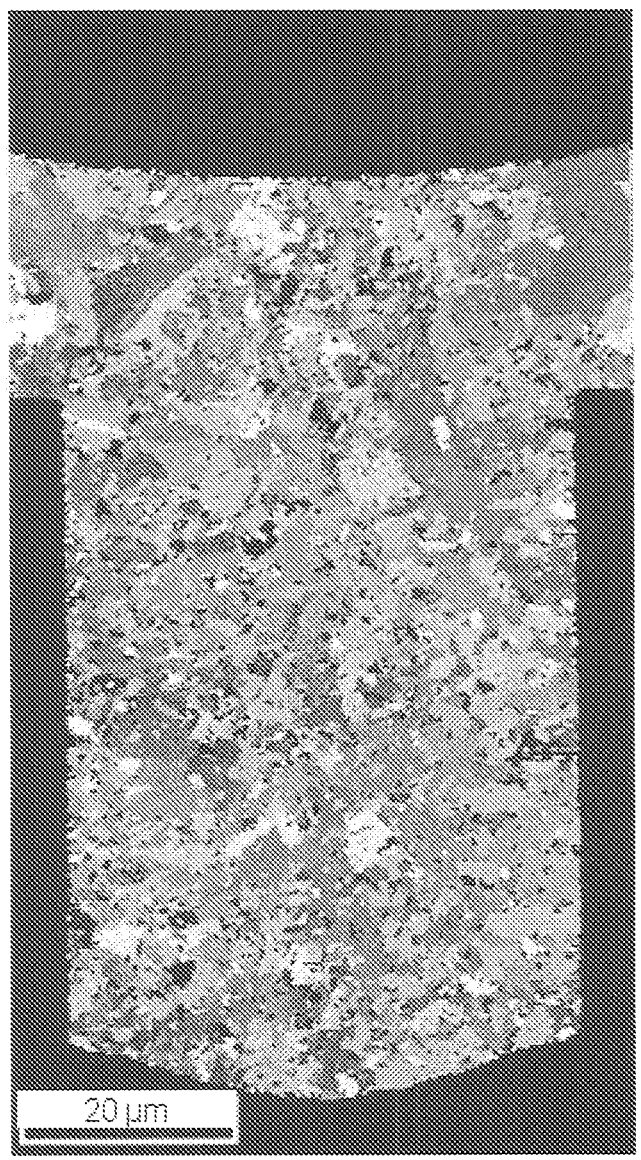
Figure 12B:
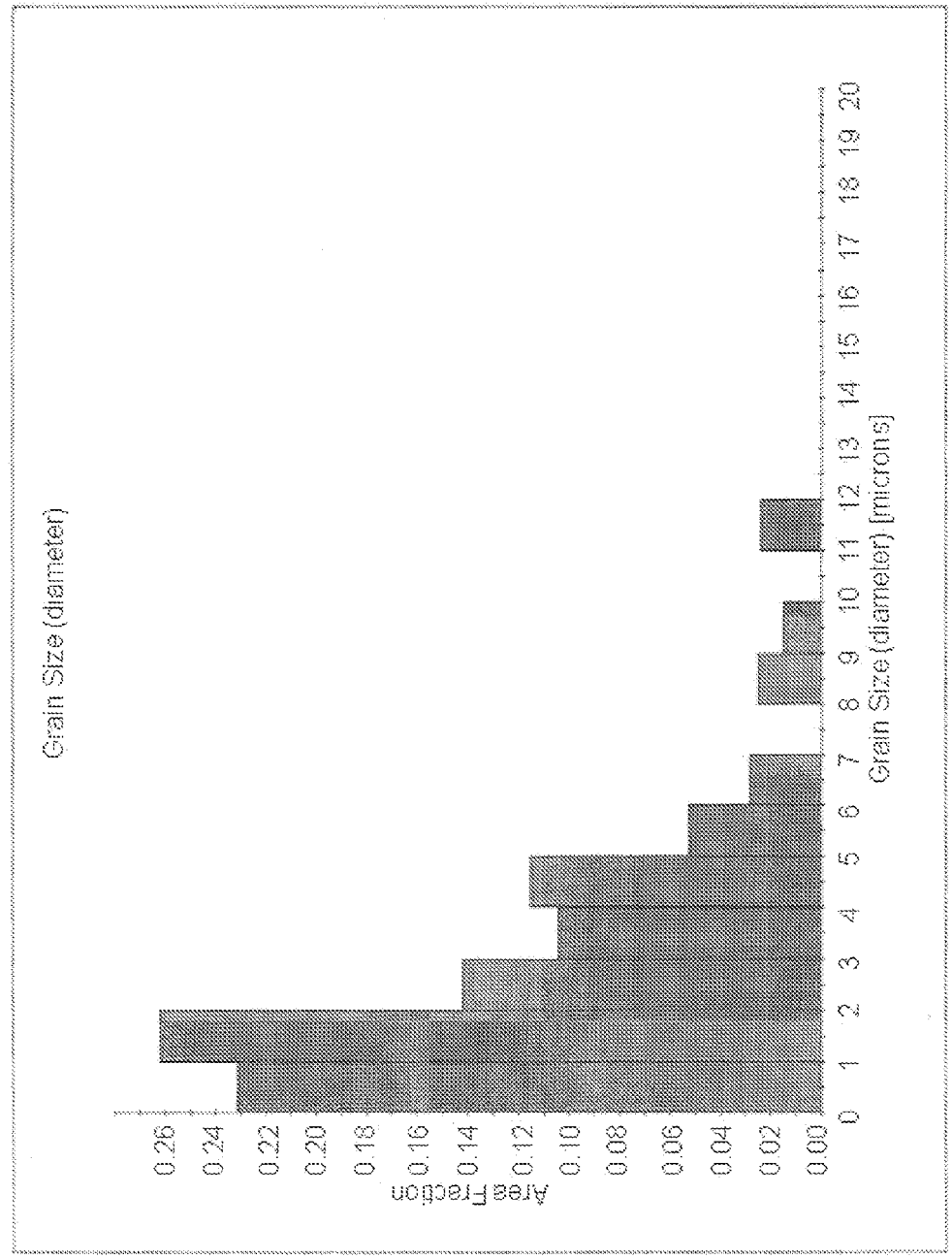

In addition, an area weighted crystal grain diameter distribution chart of the crystal of a metal material which forms the conductive part of the through hole electrode substrate in comparative example two are shown in FIG. 12A, FIG. 12B and FIG. 12C. The maximum grain diameter of a metal material which forms the conductive part of the through hole electrode substrate in comparative example two was 11 μm and the average grain diameter (area weighted) was 2 μm. In order to measure the resistance value of the conductive part of the through hole electrode substrate in comparative example two, the unnecessary parts of the seed layer 114 and the conductive part 106 are removed and the surface of the substrate 102 which is on the opposite side of the side on which the hole 112 is formed, is polished until the surface of the conductive part 106 is exposed as is shown in FIG. 3. The resistance value of the conductive part 106 of the through hole electrode substrate 100 in comparative example two was $1.08 \times 10^{-3} \Omega$ and it was confirmed that the electrical properties of the conductive part 106 were poor compared to example one.

The maximum grain diameter and average grain diameter in example one, comparative example one and comparative example can be shown as in the following table.

TABLE 1

| | average grain diameter (area weighted) [μm] | maximum grain diameter [μm] |
|---|---|---|
| Example 1 | 13 | 29 |
| Comparative example 1 | 2 | 10 |
| Comparative example 2 | 2 | 11 |

From the above results, when the average grain diameter (area weighted) of the conductive part 106 of the through hole electrode substrate 100 is 13 μm or more, the resistance value is small and the conductive part 106 has excellent electrical properties. This is because when the metal grain diameter of the conductive part 106 of the through hole electrode substrate 100 is large, the resistance becomes smaller. In addition, when the maximum grain diameter of the conductive part 106 of the through hole electrode substrate 100 is 29 μm or more, the resistance value is small and the conductive part 106 has excellent electrical properties.

Here, in example one, a metal filling start side of the conductive part 106 on which a cap shaped metal layer is formed by supplying a direct current and a metal filling end side at which the metal material is filled by supplying a pulse current are compared and a crystal grain diameter is measured.

FIG. 9 is a diagram which shows a region in which a measurement is performed of a crystal grain diameter of a metal material which is filled into the conductive part 106. The measurement region is comprised of a direct current region 106b, direct current-pulse switching region 106c and a pulse current later period region 106d from the side where plating starts. In the direct current region 106b the filling speed of a part which contacts the substrate 102 tends to be rapid, and at the boundary of switching from the direct current to the pulse current becomes a filling state of the crystal of the metal material in which the center part of the conductive part 106 warps.

Figure 13A:
Figure 13B:
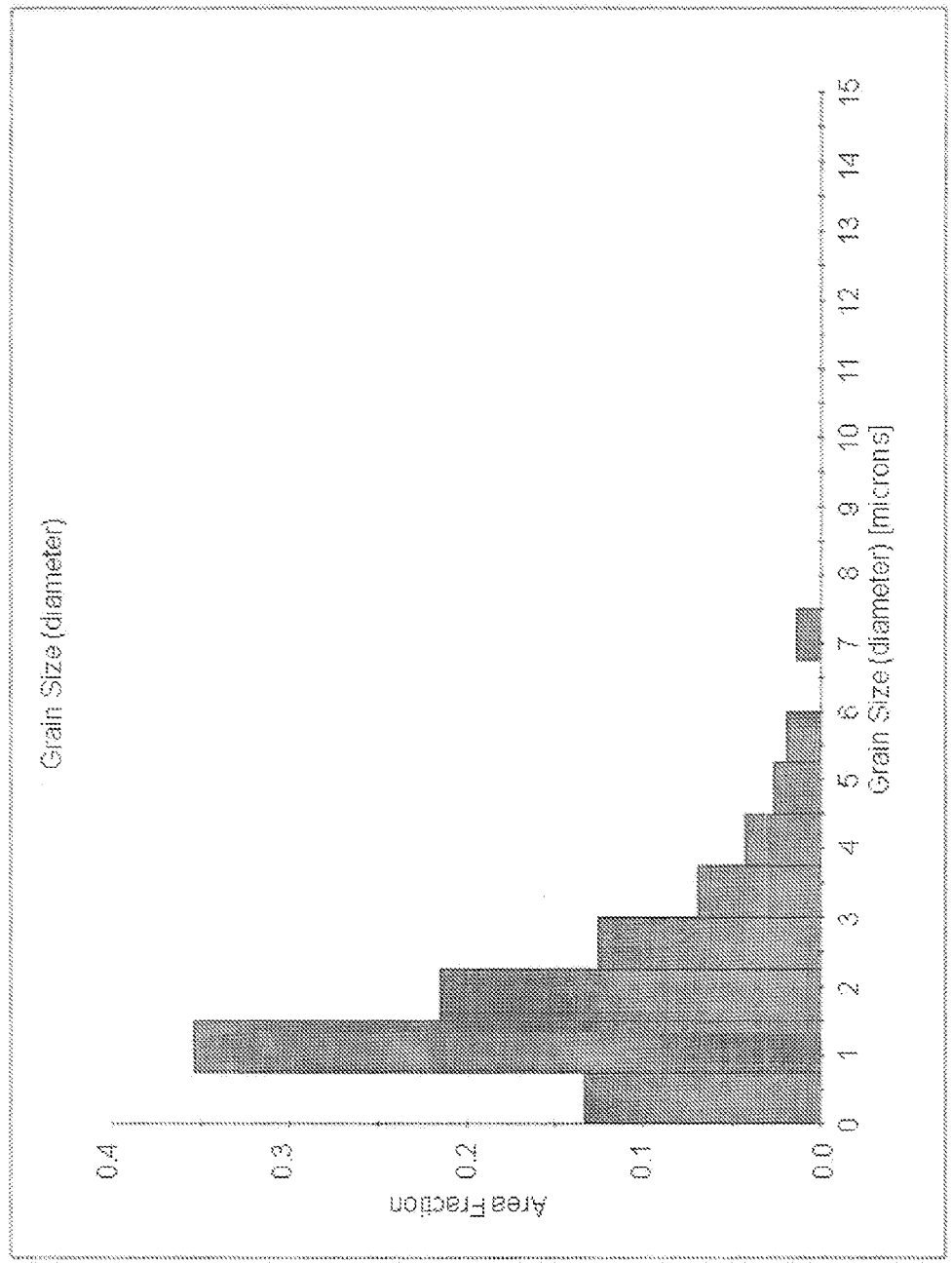
Figure 14A:
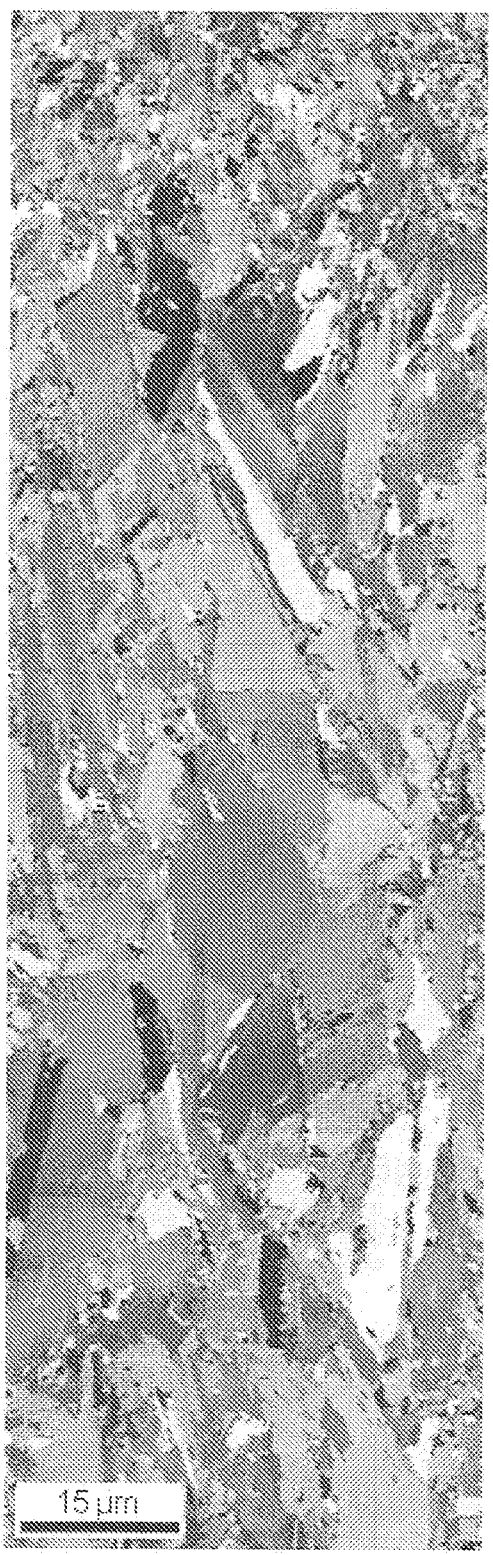
Figure 14B:
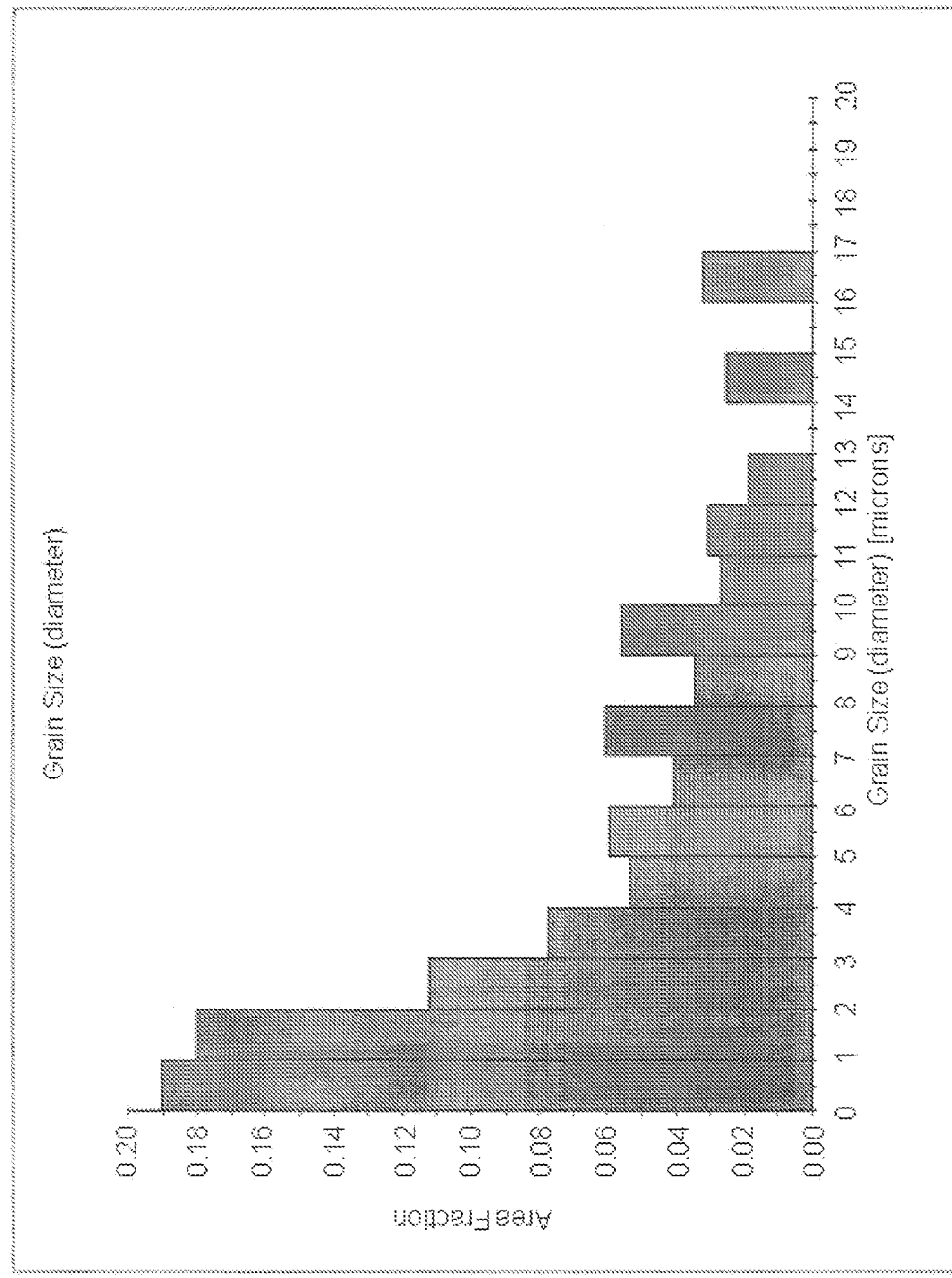
Figure 15A:
Figure 16A:

As is shown in FIG. 13A, FIG. 13B and FIG. 13C, an area weighted average grain diameter was 1.92 μm in the direct current region 106b of the conductive part 106. As is shown in FIG. 14A, FIG. 14B and FIG. 14C, an area weighted average grain diameter was 4.82 μm in the direct current-pulse switching region 106c. However, as is shown in FIG. 15A, FIG. 15B and FIG. 15C, in a pulse current initial period region 106e of the direct current-pulse switching region 106c, an area weighted average grain diameter was 5.84 μm, which is significantly larger compared to the direct current region. Furthermore, as is shown in FIG. 16A, FIG. 16B and FIG. 16C, an area weighted average grain diameter in the pulse current later period region 106d was 23.58 μm, and a crystal having a grain diameter of 50 μm or more was produced.

Comparative example one and comparative example two described above will be explained below.

Comparative Example One

The processes up to filling a metal material into a through hole are the same as in example one. The thickness of the substrate 102 before forming a thermally-oxidized film was 400 μm. After forming a seed layer on the substrate, the direct current shown in FIG. 6 is supplied to the seed layer using an electrolytic plating method and a metal material is filled into the conductive part. The current at this time was 1.54 A (current density 1 A/dm$^2$). Subsequent processes were the same as in example one.

Comparative Example Two

The processes up to filling a metal material into a through hole are the same as the manufacturing method of the through hole electrode substrate in 2-2. After forming a seed layer on the substrate, the direct current shown in FIG. 6 is supplied to the seed layer using an electrolytic plating method and a metal material is filled into the conductive part. The current at this time was 1.54 A (current density 1 A/dm$^2$). Subsequent processes were the same as in example one. The thickness of the substrate 102 before forming a thermally-oxidized film was 70 μm.

Figure 17:
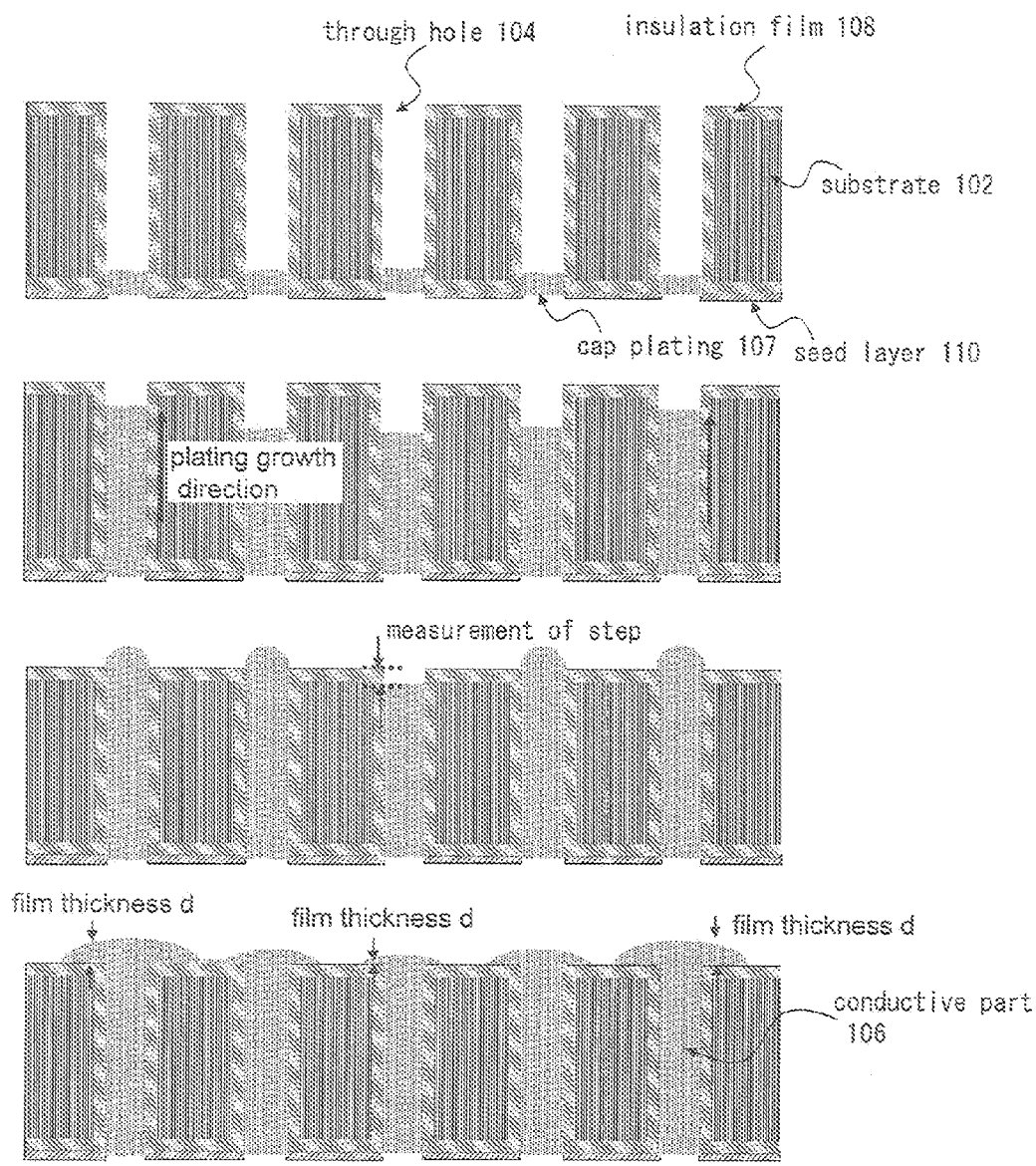
FIG. 17 is an exemplary diagram which shows a variation in growth speed and a film thickness of filling plating by an electrolytic plating method.

The electrolytic plating method is used in both example one and comparative example 1, and as is shown in FIG. 17, the growth speed of the filling plating is different in each conductive part of the through hole electrode substrate. In the electrolytic plating method, as is shown in FIG. 17 (*a*), a cap plating 107 is formed by a metal material on the seed layer 110 side of the through hole 104 and a metal material is filled as is shown in FIG. 17 (b). Here, [cap plating] refers to a metal layer which is formed so that an aperture part of a through hole is closed, wherein, in the initial stage of electrolytic plating a metal material is deposited on the surface of the seed layer, and by concentrating depositing a metal material on an aperture part of a through hole which has a high electrolytic density. A metal layer grows from the cap plating 107 in the upper direction of the through hole 104 by the electrolytic plating method. At this time, the growth speed of the metal layer becomes different for each through hole 104.

Filling of a metal material by the electrolytic plating method is performed while measuring the difference in levels between the insulation film 108 and the plating filed into the through hole 104, and finishes at the point where the difference in levels between the upper surface of a metal layer in the through hole 104 in which the growth shown in FIG. 17 (c) is slowest and the surface of the insulation film 108 of the substrate 102 has disappeared. A film thickness d of a metal layer which grows and sticks out from the through hole electrode substrate in a number of conductive parts were measured and compared as is shown in FIG. 17 (d) with regards to a through hole electrode substrate in which all through holes 104 have been filled with a metal layer.

Figure 18:
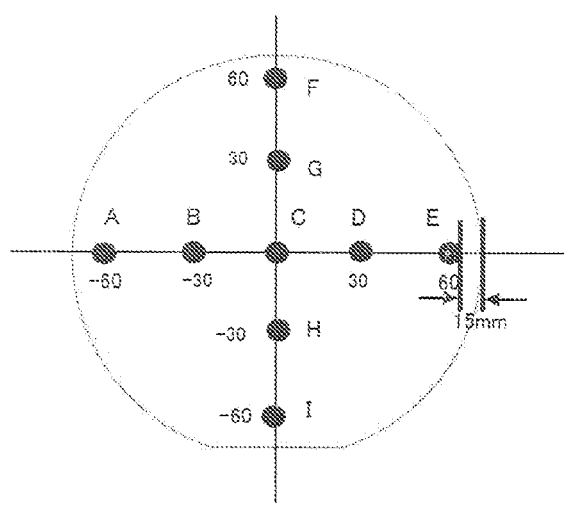
FIG. 18 is an exemplary diagram which shows a measurement position of a plating film thickness d of the conductive part 106 of the through hole electrode substrate 100 of the present invention related to one embodiment.

The film thickness d was measured of conductive parts at nine measurement points (A-I) as shown in FIG. 18 in example one and comparative example one. Measurements were performed on three substrates in example one and measurements were performed using four substrates in comparative example one. Those measurement results are shown in table two.

TABLE TWO

|  | example 1 | | | comparative example 1 | | | |
| --- | --- | --- | --- | --- | --- | --- | --- |
|  | 1 | 2 | 3 | 1 | 2 | 3 | 4 |
| Variation (%) | 13 | 10 | 8 | 50 | 69 | 69 | 62 |

Variation in film thickness is expressed as ave for average film thickness, Max for a maximum value of a film thickness and Min for a minimum value {(Max−Min)/ave/2×100}. As is shown in table two, when looking at the variation between each substrate, the variation in film thickness in example one is small around 10%, however, in comparative example one, there were substrates which showed variation in film thickness of 50% or more and close to 70%. In other words, growth of a metal layer by supplying a pulse current in example one demonstrated excellent effects of being able to realize uniform growth with little variation compared to the growth of a metal layer by supplying a direct current in comparative example one.

Embodiment Two

An example of a semiconductor device having LSI chips stacked on the through hole electrode substrate 100 of the present invention related to embodiment one and an example of a semiconductor device stacked with a plurality of through hole electrode substrates 100 of the present invention related to embodiment one is explained in embodiment two. Furthermore, the same structure and manufacturing methods as in embodiment one are not explained again here.

Figure 19:
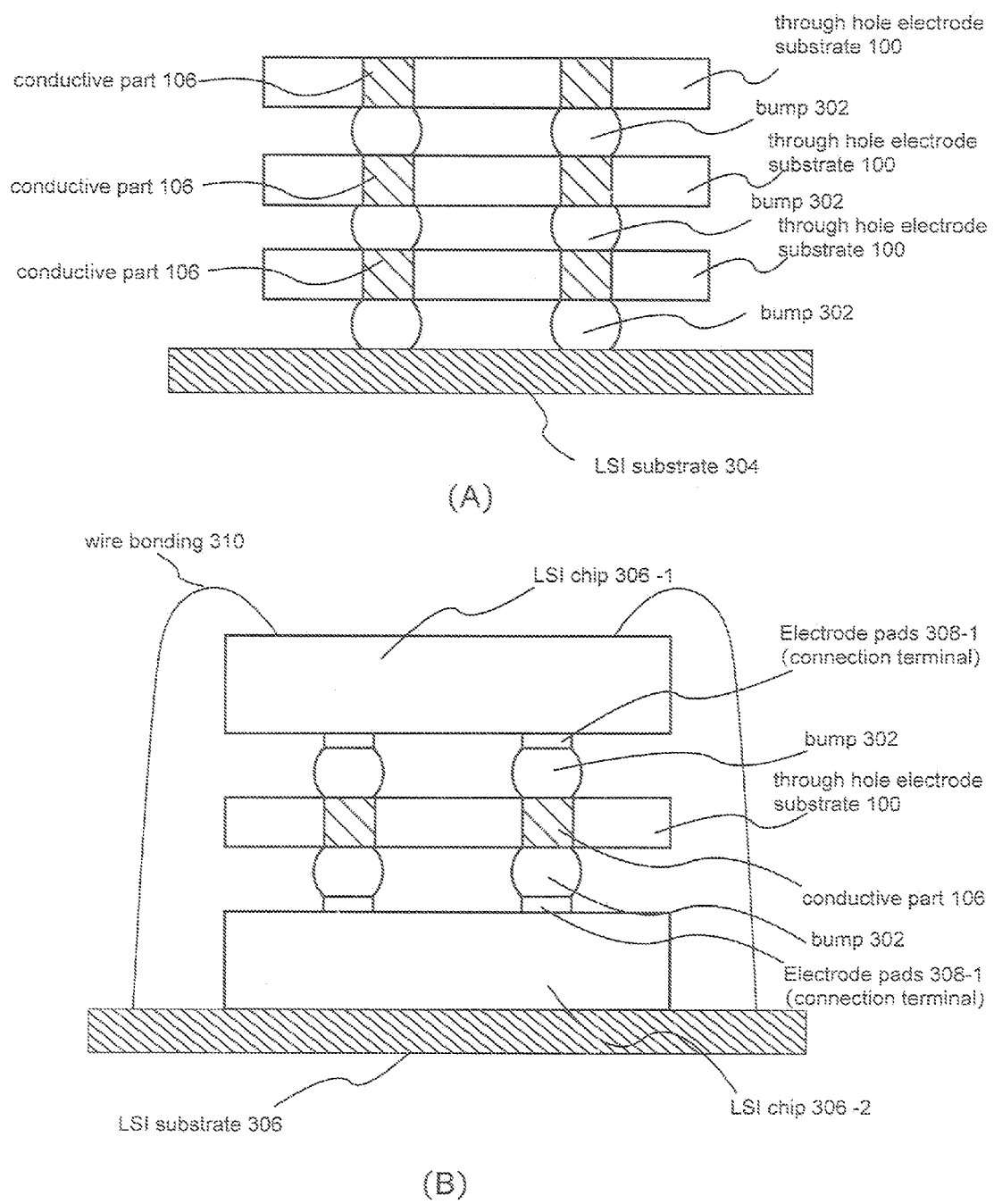
FIG. 19 is a cross sectional diagram for explaining a semiconductor device stacked with an LSI chip on the through hole electrode substrate 100 related to the present invention, and also for explaining a stacked type through hole electrode substrate stacked with the through hole electrode substrate 100 related to the present invention.

FIG. 19 (A) and FIG. 19 (B) are referred to. In FIG. 19 (A) a semiconductor device related to the present embodiment stacked with three through hole electrode substrates 100 of the present invention related to embodiment one is shown. Semiconductor elements such as DRAM are formed on the through hole electrode substrates 100. The three through hole electrode substrates 100 are stacked and are connected to each other via a bump 302. The through hole electrode substrates 100 act as an interposer which electrically connects a DRAM formed on each of the substrates. The through hole electrode substrates 100 stacked in three layers are connected to an LSI substrate 304 via the bump 302. Furthermore, the number of through hole electrode substrates 100 which are stacked is not limited to three. It is possible to use In (indium), Cu or Au etc for the bump 304. In addition, in the main a resin such as polymide or BCB (benzocyclobutene) may be attached by coating or burning for bonding the through hole electrode substrates 100. In addition, an epoxy resin may also be used in bonding through hole electrode substrates 100. Furthermore, bonding by plasma activation or eutectic bonding may be used as the bonding of the through hole electrode substrates 100.

In the case where the through hole electrode substrates 100 of the present invention are stacked as in the present embodiment, when the resistance of the conductive parts 106 (through holes) is Ri, and the number of stacked layers of the through hole electrode substrates 100 of the present invention, which are connected is N, the entire resistance of the conductive parts 106 (through holes) which are connected in series becomes N×Ri, and it is possible to reduce the resistance of the conductive parts 106 (through holes).

In FIG. 19 (B), an example of a semiconductor device having through hole electrode substrates 100 mounted with LSI chips (semiconductor chips) 306-1 and 306-2 such as a MEMS device, CPU and memory is shown. Electrode pads 308-1 and 308-2 which are connection terminals of the LSI chips 306-1 and 306-2 are respectively electrically connected to conductive parts 106 of the through hole electrode substrates 100 via a bump 304. A through hole electrode substrate 100 mounted with LSI chips 306-1 and 306-2 is mounted on an LSI substrate 306 and LSI substrate 306 and LSI chip 306-1 are connected via wire bonding. For example, by making the LSI chip 306-1 a triaxial acceleration sensor and the LSI chip 306-2 a biaxial magnetic sensor, it is possible to realize a five-axis motion sensor in one module. In this way, the through hole electrode substrate 100 of the present invention related to embodiment one can be used as an interposer for mounting a plurality of LSI chips in three dimensions.

In addition, as a result of a small resistance value and improved electrical properties of the conductive part 106 as stated above in the through hole electrode substrate 100 of the present invention related to embodiment one, it is possible to reduce the amount of heat generated in the conductive part 106 when using the through hole electrode substrate 100 in a semiconductor device. In this way, it is possible to realize a semiconductor device with through hole electrode substrates 100 mounted in high density.

Embodiment Three

In embodiment three, a case of using a MEMS device as an LSI chip mounted on a through hole electrode substrate of embodiment one and embodiment two described above is explained. In the present embodiment, a MEMS device is explained using a physical amount sensor 302-1 as an example.

A process circuit which processes a variable signal of acceleration detected by physical amount sensor 302-1 is explained below.

<Process Circuit>

Figure 20:
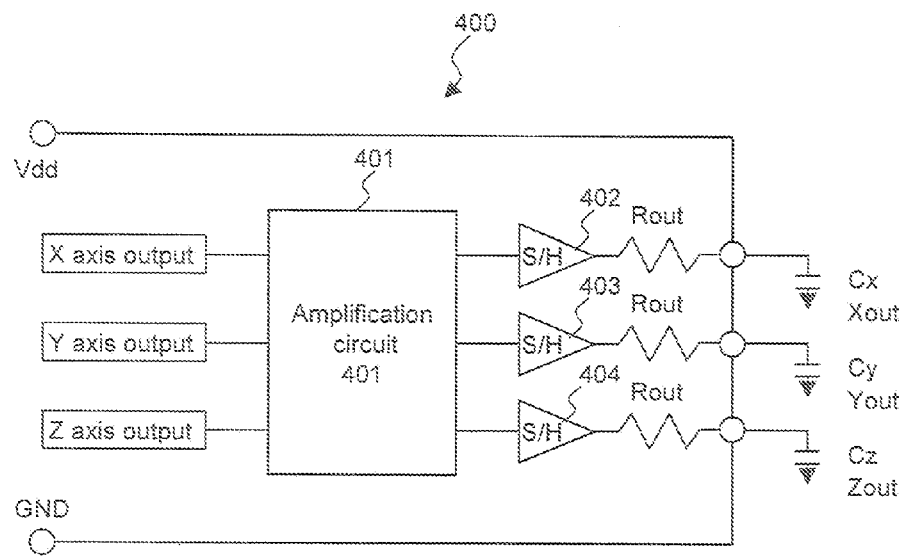
FIG. 20 is a diagram which shows one example of an acceleration process circuit which processes a variable signal of acceleration detected by a physical quantity sensor.

A structural example of each process circuit which processes a variable signal of acceleration detected by physical amount sensor 302-1 is explained while referring to FIG. 20.

FIG. 20 is a diagram which shows a circuit structure of an acceleration process circuit which processes a variable signal of acceleration detected by the physical amount sensor 302-1. In this case a physical amount sensor is a piezo resistance acceleration sensor. In FIG. 20, an acceleration process circuit 400 is comprised of an amplification circuit 401, sample hold circuits (S/H) 402-404, an output resistance Rout and capacitors Cx, Cy, Cz. Furthermore, X axis output, Y axis output and Z axis output in FIG. 20 are each variable signals in an X axis direction, Y axis direction and Z axis direction output from the physical amount sensor 302-1 according to the applied acceleration. Furthermore, the output resistance Rout and capacitors Cx, Cy, Cz function as low-pass filters which pass through a wave length component corresponding to an acceleration signal.

Amplification circuit 401 amplifies each variable signal in a Y axis direction and Z axis direction output from the physical amount sensor 302-1 according to the applied acceleration by a certain gain and outputs to each sample hold circuit 402-404. The sample hold circuit 402 sample holds the variable signal in an X axis direction amplified by the amplification circuit 401 and outputs an acceleration detection signal in the X axis direction Xout via the output resistance Rout and the capacitor Cx at a certain timing. The sample hold circuit 403 sample holds the variable signal in a Y axis direction amplified by the amplification circuit 401 and outputs an acceleration detection signal in the Y axis direction Yout via the output resistance Rout and the capacitor Cy at a certain timing. The sample hold circuit 404 sample holds the variable signal in a Z axis direction amplified by the amplification circuit 401 and outputs an acceleration detection signal in the Z axis direction Zout via the output resistance Rout and the capacitor Cz at a certain timing.

Figure 21:
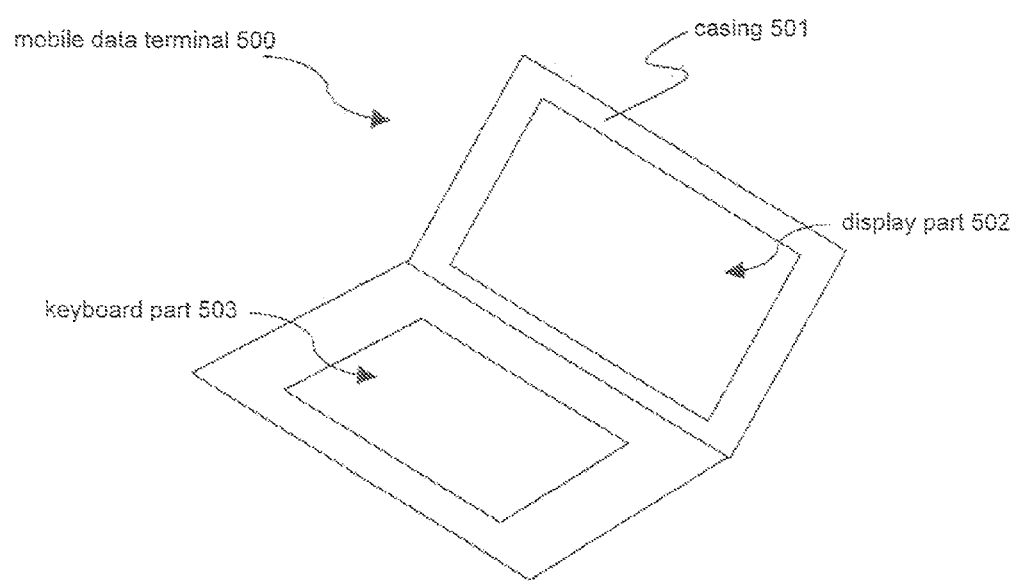
FIG. 21 is a diagram which shows one example of a mobile terminal device mounted with a sensor module.

Through hole electrode substrate 100 of the present invention mounted with this physical amount sensor 302-1 and process circuit 400 or a stacked type through hole electrode substrate 300 of the present invention are mounted on a mobile data terminal or mobile phone as a sensor module. FIG. 21 is a diagram which shows an example of a mobile data terminal 500 which is an example of a semiconductor device mounted with a through hole electrode substrate 100 of the present invention mounted with this physical amount sensor 302-1 and process circuit 400 or a stacked type through hole electrode substrate 300 of the present invention. In FIG. 21, the mobile data terminal 500 is comprised from a casing 501, a display part 502 and a keyboard part 503. A sensor module is mounted within the keyboard part 502. The mobile data terminal 500 is stored with various programs inside and includes functions which execute communication processes and data processes by each of these programs. With this mobile data terminal 500, by using the acceleration or angle detected by the sensor module mounted the physical amount sensor 302-1 and process circuit 400 in an application program, it is possible, for example, to add functions such as switching off power when acceleration is detected when the device is dropped.

It is possible to realize new functions and improve the usefulness and reliability of a mobile terminal device by mounting a sensor module mounted with the physical amount sensor 302-1 and process circuit 400 into a mobile terminal device.

According to the present invention, it is possible to provide a through hole electrode substrate, a method of manufacturing the through hole electrode substrate and a semiconductor device which uses the through hole electrode substrate which has improved electrical properties in a conductive part which passes through the front and back of the substrate.

What is claimed is:

1. A method of manufacturing a through hole electrode substrate comprising:
    forming a plurality of through holes passing through the front and back of a wafer-shaped substrate;
    forming an insulation film on a surface of the substrate and the though hole;
    forming a seed layer from a metal on at least one side of the substrate and/or the through hole;
    forming a metal layer having a cap shape on a bottom part of the through hole on a surface on which the seed layer is formed by an electrolytic plating method supplying direct current to the seed layer for a first time period; and
    filling a metal material into the plurality of through holes by an electrolytic plating method supplying a pulse current to the seed layer and the metal layer; the metal material having an area weighted average crystal grain diameter of 13 μm or more; and at one end of the through holes, having a larger area weighted average crystal grain diameter than the other end.

2. The method of manufacturing a through hole electrode substrate according to claim 1, wherein the electrolytic plating method is performed by periodically applying a plus voltage and a minus voltage to the seed layer.

3. The method of manufacturing a through hole electrode substrate according to claim 2, wherein a metal material is filled into the through hole by an electrolytic plating method supplying a second time period pulse current to the seed layer for a second time period after forming the metal layer on the bottom part of the through hole.

4. The method of manufacturing a through hole electrode substrate according to claim 1, wherein the electrolytic plating method supplying a pulse current to the seed layer includes a process for filling the metal material into the through hole while a current density of the pulse current is increased.

5. The method of manufacturing a through hole electrode substrate according to claim 2, wherein the metal material is filled into the through hole by an electrolytic plating method supplying a pulse current with a first current density to the seed layer for a third time period then a pulse current is supplied with a second current density which is larger than the first current density to the seed layer for a fourth time period after forming the metal layer on the bottom part of the through hole.

* * * * *

UNITED STATES PATENT AND TRADEMARK OFFICE
CERTIFICATE OF CORRECTION

| | | |
|---|---|---|
| PATENT NO. | : 8,637,397 B2 | Page 1 of 1 |
| APPLICATION NO. | : 13/607011 | |
| DATED | : January 28, 2014 | |
| INVENTOR(S) | : Shinji Maekawa and Miyuki Suzuki | |

It is certified that error appears in the above-identified patent and that said Letters Patent is hereby corrected as shown below:

On the title page, Item (75) Inventors, please replace "Myuki" with - Miyuki -

In the claims, column 16, claim 1, line 20, please replace "though" with - through -

Signed and Sealed this
Eighth Day of July, 2014

Michelle K. Lee
*Deputy Director of the United States Patent and Trademark Office*